United States Patent
Kim et al.

(10) Patent No.: US 10,522,081 B2
(45) Date of Patent: Dec. 31, 2019

(54) ELECTROLUMINESCENT DISPLAY CAPABLE OF UNIFORMLY IMPLEMENTING IMAGE QUALITY OF ENTIRE SCREEN AND DRIVING DEVICE THEREOF

(71) Applicant: LG DISPLAY CO., LTD., Seoul (KR)

(72) Inventors: Kyungrok Kim, Paju-si (KR); Taegung Kim, Paju-si (KR); Hyunwook Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/827,669

(22) Filed: Nov. 30, 2017

(65) Prior Publication Data

US 2018/0182288 A1 Jun. 28, 2018

(30) Foreign Application Priority Data

Dec. 28, 2016 (KR) ........................ 10-2016-0181606

(51) Int. Cl.
| | | |
|---|---|---|
| *G09G 3/3233* | (2016.01) | |
| *G09G 3/3291* | (2016.01) | |
| *G09G 3/32* | (2016.01) | |
| *G09G 3/36* | (2006.01) | |
| *H01L 27/32* | (2006.01) | |
| *G09G 3/20* | (2006.01) | |

(52) U.S. Cl.
CPC ......... *G09G 3/3233* (2013.01); *G09G 3/2044* (2013.01); *G09G 3/2059* (2013.01); *G09G 3/3291* (2013.01); *G09G 3/3666* (2013.01); *H01L 27/3244* (2013.01); *G09G 2320/0233* (2013.01)

(58) Field of Classification Search
CPC .............. G09G 3/3666; G09G 3/2051; G09G 3/2059–2066; G09G 2320/0233; G09G 3/2044; G09G 3/3233
See application file for complete search history.

(56) References Cited

U.S. PATENT DOCUMENTS

2007/0279402 A1* 12/2007 Inada ................... G09G 3/2059
345/204
2012/0127145 A1 5/2012 Jang et al.
(Continued)

FOREIGN PATENT DOCUMENTS

CN 105919428 A 9/2016

*Primary Examiner* — Xuemei Zheng
(74) *Attorney, Agent, or Firm* — Birch, Stewart, Kolasch & Birch, LLP

(57) ABSTRACT

An electroluminescent display and a driving device of the electroluminescent display are discussed. The electroluminescent display includes first and second active areas divided from a screen, a first timing controller configured to transmit the pixel data of the first active area to be displayed on the first active area to a first driving circuit writing pixel data to pixels of the first active area, a second timing controller configured to transmit the pixel data of the second active area to be displayed on the second active area to a second driving circuit writing pixel data to pixels of the second active area, and a bridge circuit configured to distribute an input image to the first and second timing controllers, detect a logo data block from the input image, and transmit the logo data block to the first and second timing controllers.

13 Claims, 18 Drawing Sheets

(56) References Cited

U.S. PATENT DOCUMENTS

| | | | |
|---|---|---|---|
| 2013/0194494 A1* | 8/2013 | Chun | G09G 3/2059 |
| | | | 348/453 |
| 2014/0160109 A1 | 6/2014 | Chen | |
| 2014/0204065 A1* | 7/2014 | Park | G09G 5/18 |
| | | | 345/204 |
| 2015/0187273 A1* | 7/2015 | Chang | G09G 3/3233 |
| | | | 345/690 |
| 2015/0339967 A1* | 11/2015 | Shin | G06F 3/1446 |
| | | | 345/690 |
| 2015/0348492 A1* | 12/2015 | Park | G09G 3/3666 |
| | | | 345/205 |
| 2016/0232852 A1 | 8/2016 | An et al. | |
| 2016/0307492 A1* | 10/2016 | Kim | G09G 3/20 |

* cited by examiner (A)

(B) (C)

(A) Example where error data is not distributed to divided active areas (B) Example where error data is distributed to divided active areas

ELECTROLUMINESCENT DISPLAY CAPABLE OF UNIFORMLY IMPLEMENTING IMAGE QUALITY OF ENTIRE SCREEN AND DRIVING DEVICE THEREOF This application claims the priority benefit of Korean Patent Application No. 10-2016-0181606 filed on Dec. 28, 2016 in the Republic of Korea, the entire contents of which are incorporated herein by reference for all purposes as if fully set forth herein.

BACKGROUND OF THE INVENTION

Field of the Invention

The present disclosure relates to a high-resolution and large-screen electroluminescent display and a driving device of the electroluminescent display.

Discussion of the Related Art

With the development of process technology and driving circuit technology for display devices, the market for high-resolution display devices is expanding. Display devices having characteristics such as high resolution, color depth expansion, and high-speed drive have been developed to achieve high image quality.

Ultra-high definition (UHD) has 8.3 million pixels (=3840×2160). The number of pixels in UHD is about four times more than the number of pixels in full-high definition (FHD) which has 2.07 million pixels (=1920×1080). Thus, the UHD can reproduce an input image more precisely than the FHD, thereby achieving clearer and smoother image quality. The pixel means a minimum unit dot constituting a computer display or a computer image. The number of pixels means pixels per inch (PPI).

A resolution of HD is expressed by "K", for example, 2K and 4K. Here, "K" is a digital cinema standard and stands for "Kilo" or 1,000. Further, "4K" is four times a resolution of FHD and is sometimes called quad full high definition (QFHD), ultra-definition (UD), or UHD. In recent years, researches on high-resolution and large-screen display devices of 8K resolution (7680×4320) have been actively conducted by leading companies of display devices.

A display device includes a display panel driving circuit for writing pixel data of an input image to pixels. The display panel driving circuit includes a data driver circuit supplying data signals to data lines of a pixel array and a gate driver circuit (also referred to as "scan driver circuit") sequentially supplying gate pulses (also referred to as "scan pulses") synchronized with the data signals to gate lines (also referred to as "scan lines") of the pixel array. The display panel driving circuit further includes a timing controller that transmits the pixel data of the input image to the data driver circuit and controls operation timings of the data driver circuit and the gate driver circuit.

An electroluminescent display is classified as an inorganic light emitting display and an organic light emitting diode display depending on the material of an emission layer. An active matrix organic light emitting diode display includes a plurality of organic light emitting diodes capable of emitting light by themselves and has many advantages, such as fast response time, high emission efficiency, high luminance, wide viewing angle, and the like. As the resolution of the electroluminescent display increases, a variation in the driving characteristics between pixels increases depending on the position of the pixels on the screen over time. Thus, it is difficult to implement a high-resolution and large-screen electroluminescent display capable of making the image quality of entire screen uniform.

SUMMARY OF THE INVENTION

The present disclosure provides a high-resolution and large-screen electroluminescent display capable of uniformly implementing image quality of entire screen and a driving device of the electroluminescent display.

In one aspect, there is provided an electroluminescent display including first and second active areas divided from a screen on which pixels are disposed in a matrix, a first driving circuit configured to write pixel data to pixels of the first active area, a first timing controller configured to transmit the pixel data of the first active area to be displayed on the first active area to the first driving circuit and control the first driving circuit, a second driving circuit configured to write pixel data to pixels of the second active area, a second timing controller configured to transmit the pixel data of the second active area to be displayed on the second active area to the second driving circuit and control the second driving circuit, and a bridge circuit configured to distribute an input image to the first and second timing controllers, detect a logo data block from the input image, and transmit the logo data block to the first and second timing controllers.

In another aspect, there is provided an electroluminescent display including a first active area disposed in an upper left portion of a screen on which pixels are disposed in a matrix, a second active area disposed in an upper right portion of the screen, a third active area disposed in a lower left portion of the screen, a fourth active area disposed in a lower right portion of the screen, a first driving circuit configured to write pixel data to pixels of the first active area, a first timing controller configured to transmit the pixel data of the first active area to be displayed on the first active area to the first driving circuit and control the first driving circuit, a second driving circuit configured to write pixel data to pixels of the second active area, a second timing controller configured to transmit the pixel data of the second active area to be displayed on the second active area to the second driving circuit and control the second driving circuit, a third driving circuit configured to write pixel data to pixels of the third active area, a third timing controller configured to transmit the pixel data of the third active area to be displayed on the third active area to the third driving circuit and control the third driving circuit, a fourth driving circuit configured to write pixel data to pixels of the fourth active area, a fourth timing controller configured to transmit the pixel data of the fourth active area to be displayed on the fourth active area to the fourth driving circuit and control the fourth driving circuit, and a bridge circuit configured to distribute an input image to the first to fourth timing controllers, detect a logo data block from the input image, and transmit the logo data block to the first to fourth timing controllers.

In yet another aspect, there is provided a driving device of an electroluminescent display, which includes a first timing controller configured to transmit pixel data of a first active area to be displayed on the first active area to a first driving circuit writing pixel data to pixels of the first active area and control the first driving circuit, a second timing controller configured to transmit pixel data of a second active area to be displayed on the second active area to a second driving circuit writing pixel data to pixels of the second active area and control the second driving circuit, and a bridge circuit configured to distribute an input image to the first and second timing controllers, detect a logo data block from the input image, and transmit the logo data block to the first and second timing controllers.

In still yet another aspect, there is provided a driving device of an electroluminescent display, which includes a first timing controller configured to transmit pixel data of a first active area to be displayed on the first active area to a first driving circuit writing pixel data to pixels of the first active area and control the first driving circuit, a second timing controller configured to transmit pixel data of a second active area to be displayed on the second active area to a second driving circuit writing pixel data to pixels of the second active area and control the second driving circuit, a third timing controller configured to transmit pixel data of a third active area to be displayed on the third active area to a third driving circuit writing pixel data to pixels of the third active area and control the third driving circuit, a fourth timing controller configured to transmit pixel data of a fourth active area to be displayed on the fourth active area to a fourth driving circuit writing pixel data to pixels of the fourth active area and control the fourth driving circuit, and a bridge circuit configured to distribute an input image to the first to fourth timing controllers, detect a logo data block from the input image, and transmit the logo data block to the first to fourth timing controllers.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
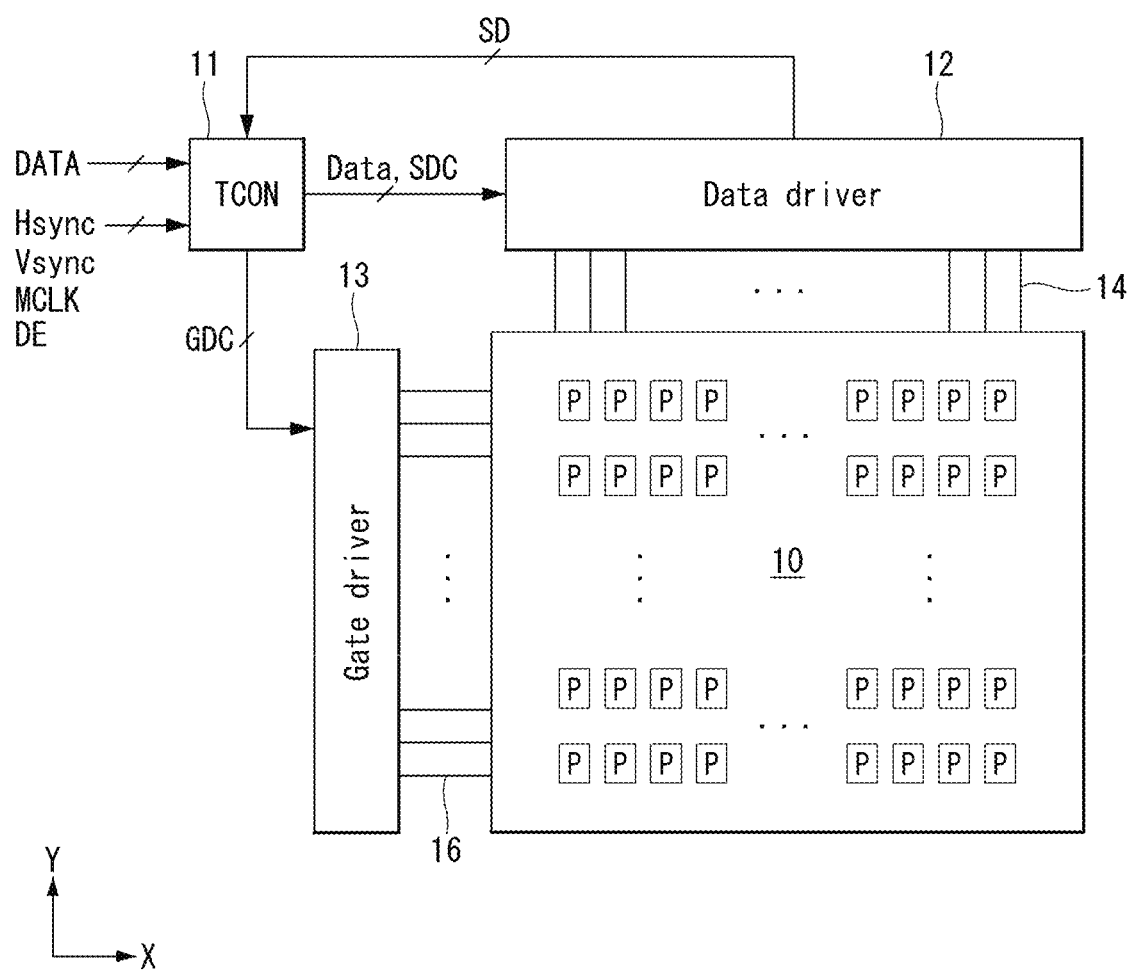
FIG. 1 is a block diagram schematically illustrating an electroluminescent display according to an embodiment of the disclosure.

In the following description, embodiments of the disclosure are described using an organic light emitting diode (OLED) display as an example of an electroluminescent display. However, embodiments are not limited thereto. Each pixel of an OLED display according to embodiments of the disclosure includes a driving element for controlling a current flowing in an OLED. The driving element may be implemented as a transistor. It is preferable that the driving elements of all the pixels are designed to have the same electrical characteristics including a threshold voltage, mobility, etc. However, the electrical characteristics of the driving elements are not uniform due to process conditions, a driving environment, and the like. As a driving time of the OLED and the driving element increases, a stress of the OLED and the driving element increases. There is a difference in an amount of stress depending on a data voltage. The electrical characteristics of the driving element are affected by the stress. As a driving time of the pixels increases, the pixels are degraded. A reduction in image quality is visible on the screen due to a difference in degradation between the pixels. Thus, the OLED display compensates for degradation in driving characteristics of the pixels using an internal compensation method and an external compensation method, in order to compensate for the degradation in the driving characteristics of the pixels and make the driving characteristics of the pixels uniform.

The internal compensation method automatically compensates for a variation in a threshold voltage between the driving elements in a pixel circuit. In order to implement the internal compensation, the pixel additionally includes an internal compensation circuit, which compensates for a data voltage by threshold voltages of the OLED and the driving element inside the pixel so that a current flowing in the OLED is not affected by the threshold voltages of the OLED and the driving element.

The external compensation method senses the driving characteristics (including the threshold voltage, mobility, etc.) of the pixel and modulates pixel data of an input image based on the sensing result by a compensation circuit outside a display panel, thereby compensating for change in driving characteristics of each pixel.

More specifically, the external compensation method senses a voltage or a current of the pixel through a sensing circuit connected to the pixels of the display panel, converts the sensing result into digital data using an analog-to-digital converter (ADC), and transmits the digital data to a timing controller. The timing controller modulates digital video data of the input image based on the result of sensing the pixel and compensates for change in the driving characteristics of each pixel.

In the following description, embodiments of the disclosure illustrate a pixel circuit connected to a sensing circuit for external compensation, by way of example. However, embodiments are not limited thereto. For example, the pixel circuit according to embodiments of the disclosure may further include an internal compensation circuit.

Reference will now be made in detail to embodiments of the present disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the present disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include", "have", "comprised of", etc. are used, other components may be added unless "~only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present invention.

The features of various embodiments of the present disclosure can be partially combined or entirely combined with each other, and can be technically interlocking-driven in various ways. The embodiments can be independently implemented, or can be implemented in conjunction with each other.

In the following description, an algorithm means a data operation processing method of modulating pixel data using a previously set operation method, in order to improve image quality, power consumption, and life span. A compensation value used in the algorithm or obtained through the calculation of the algorithm is multiplied by or added to the pixel data. In embodiments of the disclosure, the compensation value may be expressed by a gain, an offset, a weight value, a coefficient, or the like. In a data operation process of the algorithm, the number of bits of the pixel data may increase. Before the pixel data is transmitted to a data driver in order to represent a gray level that can be represented in the pixel, the number of bits of the pixel data may decrease. A decrease in the number of bits leads to an error, and the error is distributed to the neighboring pixels by a predetermined error diffusion algorithm.

Various embodiments of the present disclosure will be described in detail below with reference to the accompanying drawings. In the following embodiments, an electroluminescent display will be described focusing on an organic light emitting diode (OLED) display including an organic light emitting material. However, it should be noted that embodiments of the disclosure are not limited to the OLED display, and may be applied to an inorganic light emitting display including an inorganic light emitting material. Further all display devices including electroluminescent displays according to all embodiments of the present invention are operatively coupled and configured.

Figure 2:
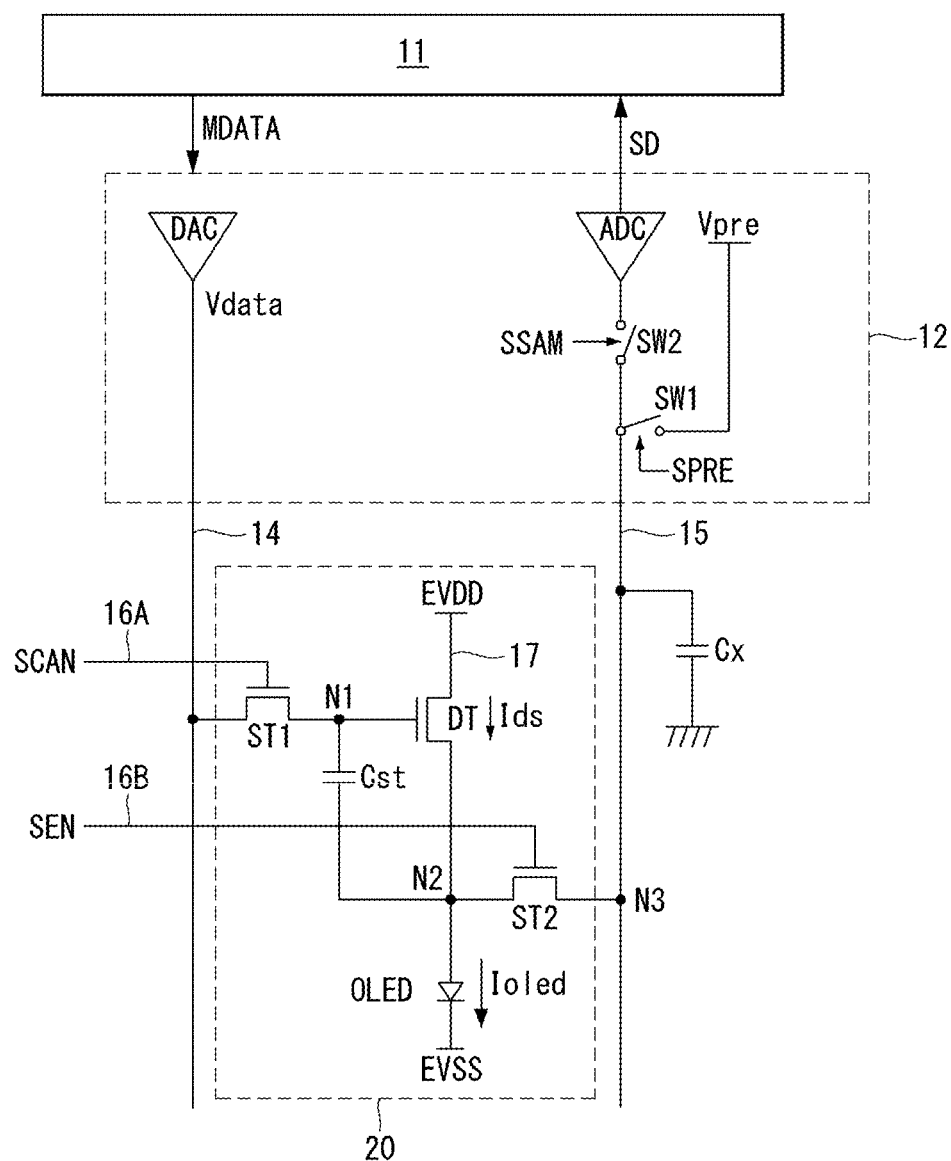
FIG. 2 illustrates in detail a connection structure between a timing controller, a data driver, and a pixel according to an embodiment of the disclosure.

Referring to FIGS. 1 and 2, an electroluminescent display according to an embodiment of the disclosure includes an active area 10 in which pixels P are arranged in a matrix, and a display panel driving circuit for writing pixel data of an input image to the pixels P of the active area 10.

In the active area 10, a plurality of data lines 14 and a plurality of gate lines 16 intersect each other, and the pixels P are arranged in the matrix. The active area 10 further includes sensing lines 15, power lines 17 for supplying a high potential pixel driving power voltage EVDD, electrodes for supplying a low potential power voltage EVSS, and the like. A reference voltage Vpre is supplied to the pixels P through the sensing lines 15.

The pixels P may include red (R), green (G), and blue (B) subpixels for color representation. In addition, the pixels P may further include white (W) subpixels. Each subpixel may include a pixel circuit 20 shown in FIG. 2. FIG. 2 illustrates an example of the pixel circuit. However, embodiments are not limited to the pixel circuit 20 shown in FIG. 2.

Each subpixel receives the high potential pixel driving power voltage EVDD and the low potential power voltage EVSS from a power circuit. Each subpixel may include an OLED, a driving TFT, first and second switching TFTs, a storage capacitor Cst, and the like. The TFTs constituting the subpixel may be implemented as p-type or n-type metal-oxide semiconductor field effect transistors (MOSFETs). Further, semiconductor layers of the TFTs may include amorphous silicon, polycrystalline silicon, or oxide.

Each subpixel is connected to one of the data lines 14, one of the sensing lines 15, a first gate line 16A, and a second gate line 16B.

A plurality of display lines, on which the pixels P are arranged in a line direction (for example, X-axis direction), are formed in the active area 10. The display lines of the active area 10 display data of an input image during an image display period of one frame period. During a vertical blanking interval excluding the image display period from one frame period, driving characteristics of pixels arranged on a line (hereinafter referred to as "sensing target line") to be sensed are sensed.

The display panel driving circuit includes a data driver 12 supplying data signals to the data lines 14, a gate driver 13 sequentially supplying gate pulses (or referred to as "scan pulses") synchronized with the data signals to the gate lines (or referred to as "scan lines") 16, and a timing controller 11 for controlling the data driver 12 and the gate driver 13.

During the image display period, the gate driver 13 sequentially supplies image display scan pulses to the gate lines 16 under the control of the timing controller 11. During the vertical blanking interval, the gate driver 13 supplies sensing scan pulses to the gate lines 16 connected to the pixels P of the sensing target line.

The image display scan pulses include first image display scan pulses SCAN sequentially supplied to the first gate lines 16A and second image display scan pulses SEN sequentially supplied to the second gate lines 16B. The sensing scan pulses include first sensing scan pulses SCAN supplied to the first gate lines 16A connected to the pixels P of the sensing target line and second sensing scan pulses SEN supplied to the second gate lines 16B connected to the pixels P of the sensing target line. The gate driver 13 may be formed on a substrate of a display panel together with a thin film transistor (TFT) array of the active area 10.

The data driver 12 supplies a data voltage Vdata to the data lines 14 and supplies the reference voltage Vpre to the sensing lines 15 under the control of the timing controller 11. The data driver 12 converts a sensing voltage received from the pixels P through the sensing lines 15 into digital data through an analog-to-digital converter (ADC), outputs sensing data SD, and transmits the sensing data SD to the timing controller 11. The data voltage Vdata may be divided into an image display data voltage, a sensing data voltage, and the like. However, embodiments are not limited thereto.

The data driver 12 supplies the image display data voltage of the input image to the data lines 14 in synchronization with the image display scan pulse and supplies the sensing data voltage to the data lines 14 in synchronization with the sensing scan pulse. The image display data voltage indicates a data voltage, in which a compensation value for compensating for change in driving characteristics of the pixel based on a result of sensing the driving characteristics of the pixel is reflected. The compensation value may include an offset value and a gain value, but is not limited thereto. The data driver 12 includes source driver integrated circuits (ICs) and may be connected to the data lines 14.

The timing controller 11 generates timing control signals SDC and GDC for controlling operation timings of the data driver 12, the gate driver 13, and a sensing circuit based on timing signals, such as a vertical sync signal Vsync, a horizontal sync signal Hsync, a main clock MCLK, and a data enable signal DE. As shown in FIG. 2, the sensing circuit includes the sensing line 15, a sensing capacitor Cx, switching elements SW1 and SW2, an ADC, and the like. The timing controller 11 modulates image display digital data to be supplied to the pixel using the compensation value during the image display period, in order to compensate for change in driving characteristics of the pixel based on the sensing data SD received from the data driver 12. In FIG. 2, "MDATA" indicates image display data that is modulated by the timing controller 11 and is transmitted to the data driver 12.

The timing controller 11 may modulate the pixel data of the input image using the compensation value obtained through various image improvement algorithms as well as an external compensation algorithm. Image quality improvement related information from the timing controller 11 may be transmitted to a bridge IC to be described later, integrally managed, and transmitted to another timing controller.

In the example illustrated in FIG. 2, the pixel circuit 20 includes an OLED, a driving TFT DT, a storage capacitor Cst, a first switching TFT ST1, and a second switching TFT ST2.

The OLED includes an anode, a cathode, and an organic compound layer between the anode and the cathode. The organic compound layer may include a hole injection layer HIL, a hole transport layer HTL, an emission layer EML, an electron transport layer ETL, and an electron injection layer EIL, but is not limited thereto. The OLED emits light due to excitons generated by holes and electrons moving to the emission layer EML when a voltage equal to or greater than a threshold voltage of the OLED is applied between the anode and the cathode.

The driving TFT DT includes a gate electrode connected to a first node N1, a drain electrode connected to an input terminal of the high potential pixel driving power voltage EVDD, and a source electrode connected to a second node N2. The driving TFT DT controls a driving current Ioled flowing in the OLED depending on a gate-to-source voltage Vgs of the driving TFT DT. The driving TFT DT is turned on when the gate-to-source voltage Vgs is greater than a threshold voltage Vth. As the gate-to-source voltage Vgs increases, a current Ids flowing between the source electrode and the drain electrode of the driving TFT DT increases. When a source voltage of the driving TFT DT is greater than the threshold voltage of the OLED, the source-to-drain current Ids of the driving TFT DT, as the driving current Ioled of the OLED, flows through the OLED. As the driving current Ioled increases, an amount of light emitted by OLED increases. Hence, a descried gray scale is represented.

The storage capacitor Cst is connected between the first node N1 and the second node N2.

The first switching TFT ST1 includes a gate electrode connected to the first gate line 16A, a drain electrode connected to the data line 14, and a source electrode connected to the first node N1. The first switching TFT ST1 is turned on in response to the first scan pulse SCAN and applies the data voltage Vdata charged to the data line 14 to the first node N1.

The second switching TFT ST2 includes a gate electrode connected to the second gate line 16B, a drain electrode connected to the second node N2, and a source electrode connected to the sensing line 15. The second switching TFT ST2 is turned on in response to the second scan pulse SEN and electrically connects the second node N2 to the sensing line 15.

The data driver 12 is connected to the pixels P through the data lines 14 and the sensing lines 15. The data driver 12 includes a digital-to-analog converter (DAC), an ADC, an initialization switch SW1, a sampling switch SW2, and the like. The sensing capacitor Cx, that samples and stores a source voltage of the second node N2, is connected to the sensing line 15.

The DAC receives digital data and generates the data voltage Vdata (i.e., the image display data voltage and the sensing data voltage) required for a drive operation, and the luminance compensation data voltage. The DAC outputs the data voltage Vdata to the data line 14.

The sensing capacitor Cx may be provided as a separate capacitor or implemented as a parasitic capacitor connected to the sensing line 15. Charges from the pixels P are stored in the sensing capacitor Cx.

The initialization switch SW1 is turned on in response to an initialization control signal SPRE and outputs the reference voltage Vpre to the sensing line 15. The sampling switch SW2 is turned on in response to a sampling control signal SSAM and supplies the ADC with a sensing voltage, which is stored in the sensing capacitor Cx of the sensing line 15 for a predetermined time. The ADC converts the sensing voltage sampled by the sensing capacitor Cx into digital data and supplies the digital data to the timing controller 11.

Figure 3:
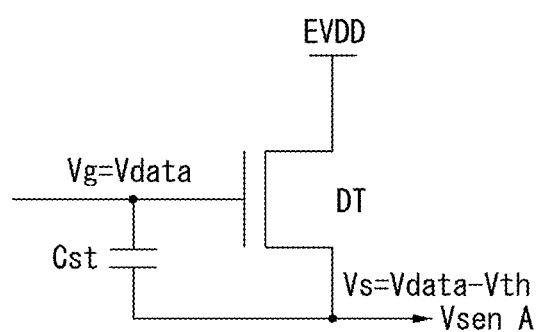
FIGS. 3 and 4 illustrate a principle of a method of sensing driving characteristics of a pixel according to an embodiment of the disclosure.
Figure 3:
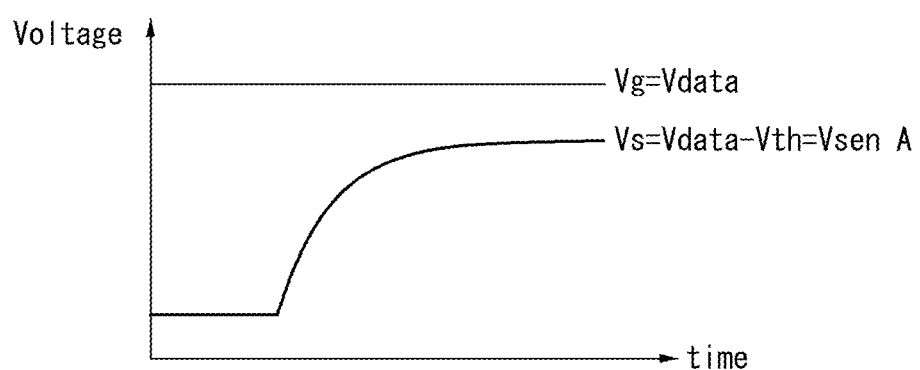
Figure 4:
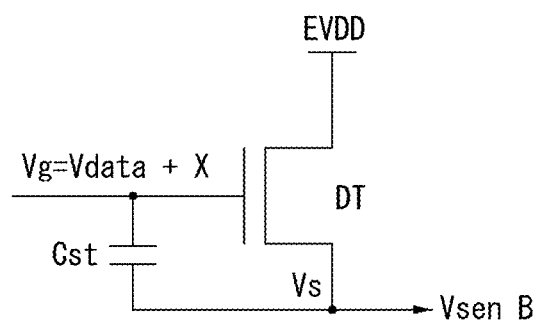
Figure 4:
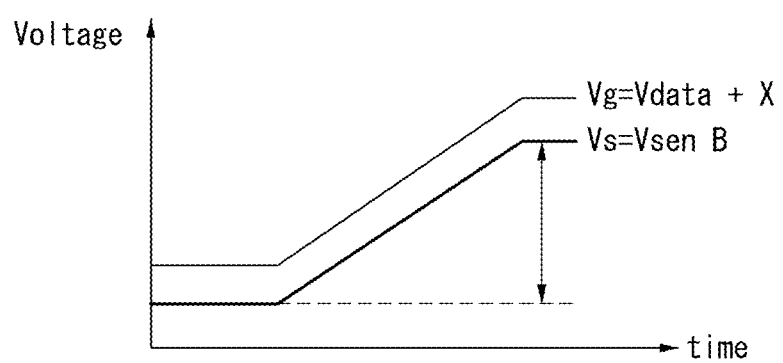

FIGS. 3 and 4 schematically illustrate a principle of a method of sensing driving characteristics (e.g., driving characteristics of a driving TFT) of a pixel. More specifically, FIG. 3 illustrates a method (hereinafter, referred to as "first sensing method") of sensing a threshold voltage of a driving TFT, and FIG. 4 illustrates a method (hereinafter, referred to as "second sensing method") of sensing mobility of a driving TFT.

Referring to FIG. 3, the first sensing method supplies a sensing data voltage Vdata to a gate of a driving TFT DT, operates the driving TFT DT using a source follower method, receives a source voltage Vs of the driving TFT DT as a sensing voltage Vsen A, and senses a threshold voltage Vth of the driving TFT DT based on the sensing voltage Vsen A. A capacitor Cst storing a gate-to-source voltage Vgs of the driving TFT DT is connected between the gate and a source of the driving TFT DT. The source voltage Vs of the driving TFT DT is expressed as follows: Vs=Vdata−Vth=Vsen A. The threshold voltage Vth of the driving TFT DT may be determined depending on a level of the sensing voltage Vsen A, and an offset value for compensating for change in the threshold voltage Vth of the driving TFT DT may be determined. The change in the threshold voltage Vth of the driving TFT DT can be compensated by adding the offset value to data of an input image. In the first sensing method, the threshold voltage Vth of the driving TFT DT has to be sensed after the gate-to-source voltage Vgs of the driving TFT DT operating as a source follower reaches a saturation state. Therefore, a relatively long time is required to sense the driving TFT DT. When the gate-to-source voltage Vgs of the driving TFT DT is saturated, a drain-to-source current of the driving TFT DT is zero.

Referring to FIG. 4, the second sensing method senses mobility μ of a driving TFT DT. The second sensing method applies a voltage Vdata+X greater than a threshold voltage of the driving TFT DT to a gate of the driving TFT DT to turn on the driving TFT DT, and receives a source voltage Vs of the driving TFT DT charged for a predetermined time as a sensing voltage Vsen B, where X is a voltage obtained according to the compensation using an offset value. The mobility of the driving TFT DT is determined depending on a magnitude of the sensing voltage Vsen B, and a gain value for data compensation is obtained based on a result of sensing the mobility. The second sensing method senses the mobility of the driving TFT DT when the driving TFT DT operates in an active region. In the active region, the source voltage Vs of the driving TFT DT rises along its gate voltage Vg. Change in the mobility of the driving TFT DT can be compensated by multiplying data of an input image by the gain value. The second sensing method can reduce time required in the sensing because the mobility of the driving TFT DT is sensed in the active region of the driving TFT DT.

Figure 5:
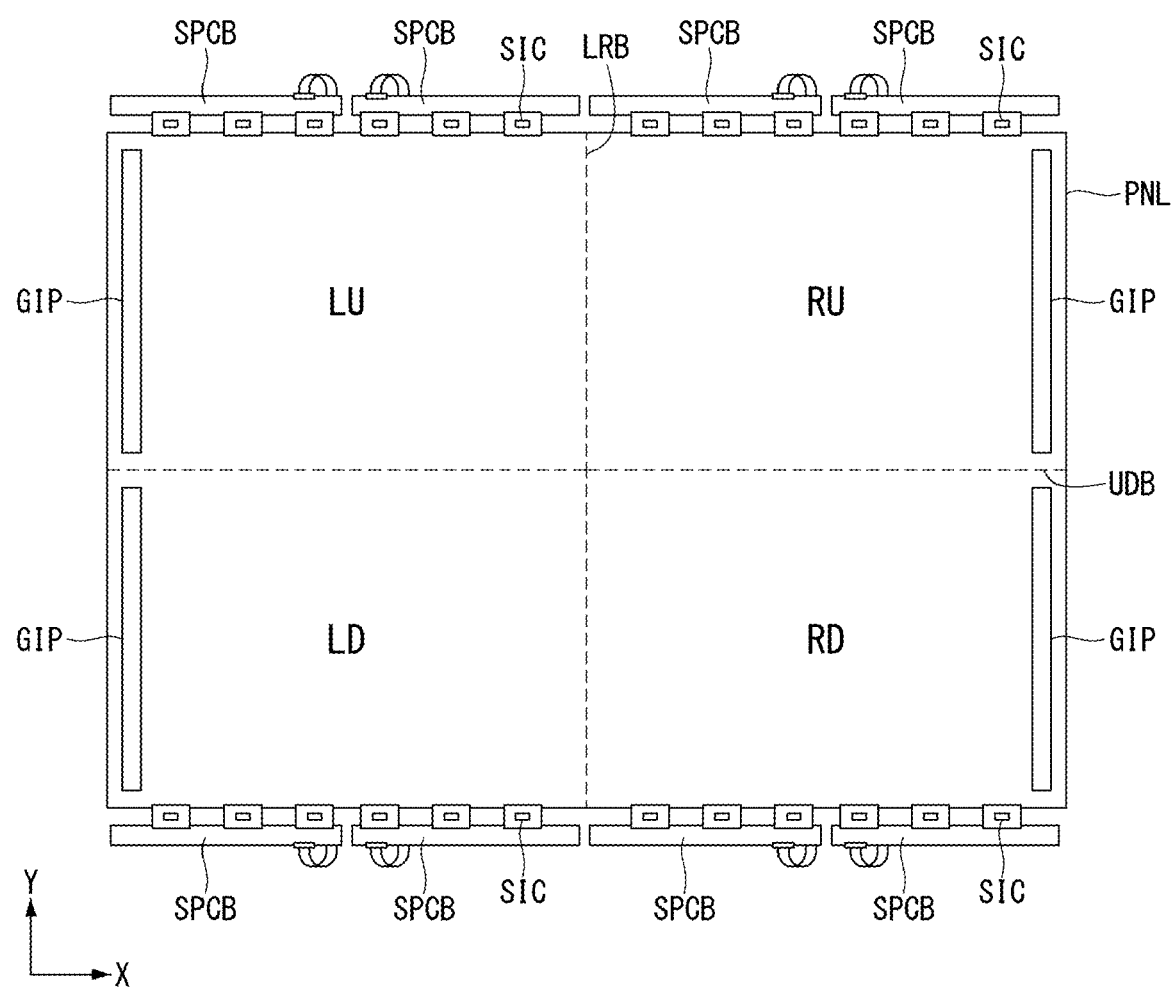
FIG. 5 is a front view of an electroluminescent display according to an embodiment of the disclosure when viewed from the front.

As shown in FIG. 5, the embodiment of the disclosure implements a high-resolution and large-screen display device by combining at least two active areas and at least two display panel driving circuits on one display panel substrate.

Figure 6:
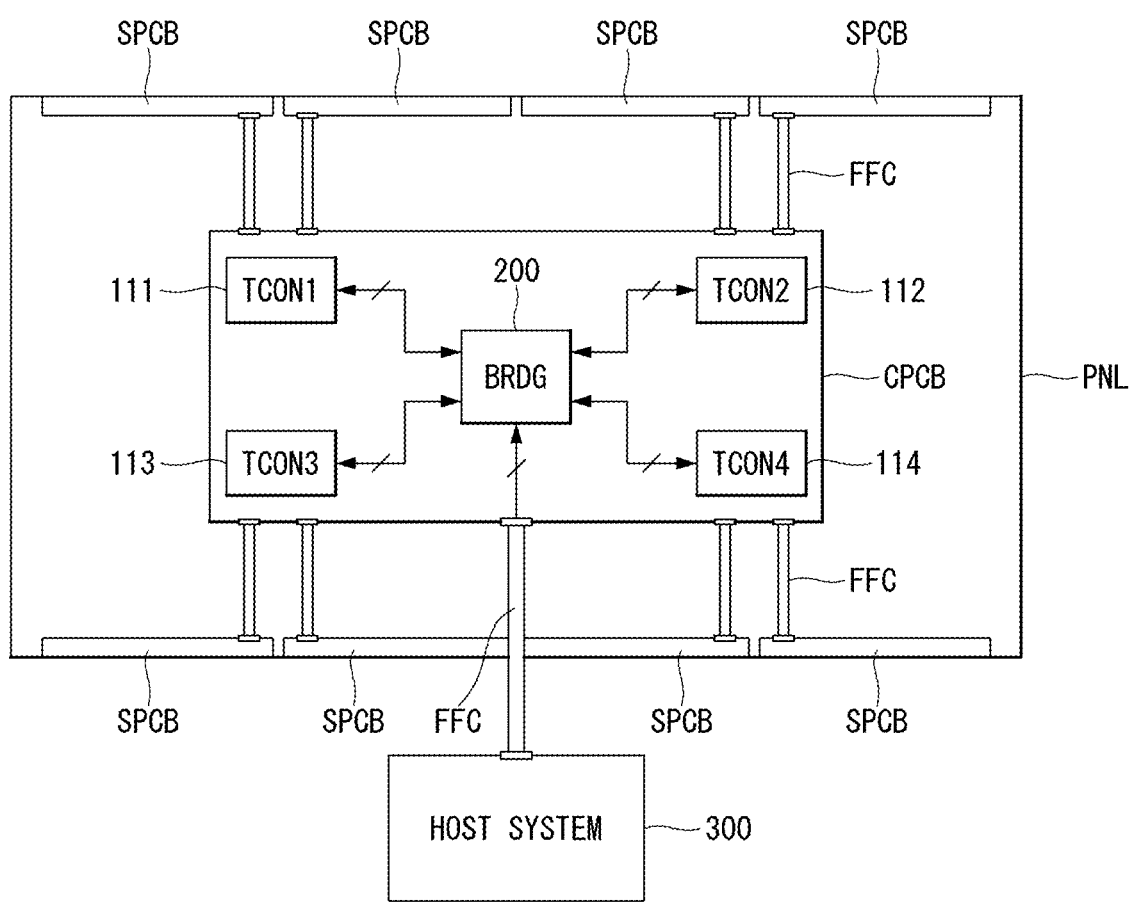
FIG. 6 is a rear view of a display device shown in FIG. 5 when viewed from the rear.
Figure 7:
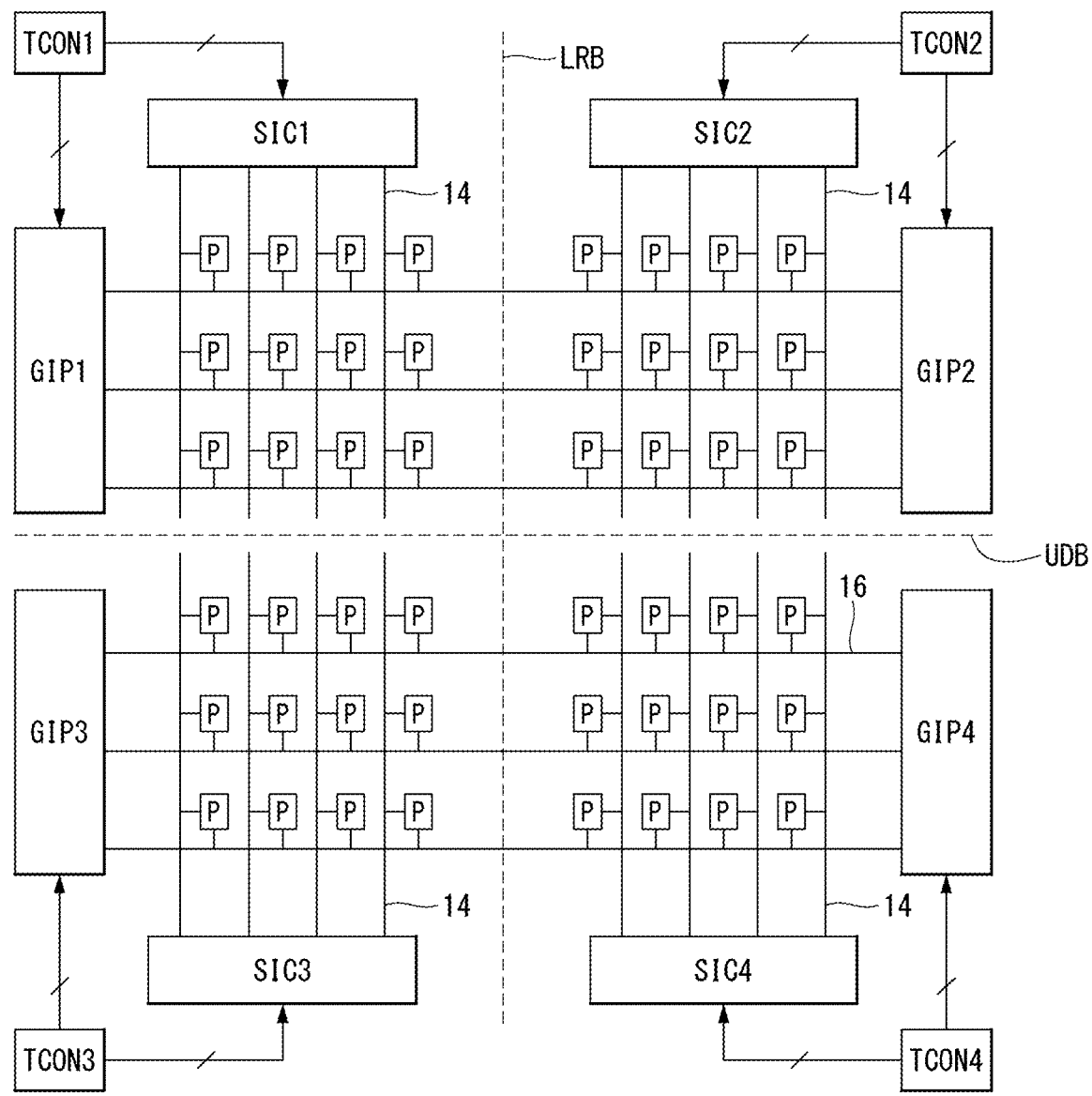
FIG. 7 schematically illustrates lines connected to pixels in an intersection portion of boundary lines on a display panel shown in FIG. 5.

FIG. 5 is a front view of an electroluminescent display according to an embodiment of the disclosure when viewed from the front. FIG. 6 is a rear view of a display device shown in FIG. 5 when viewed from the rear. FIG. 7 schematically illustrates lines connected to pixels in an intersection portion of boundary lines on a display panel shown in FIG. 5.

Referring to FIGS. 5 to 7, the electroluminescent display according to the embodiment of the disclosure includes a display panel PNL and a display panel driving circuit for writing data of an input image to the display panel PNL.

A screen of the display panel PNL is divided into four active areas. A first active area LU is disposed in an upper left half portion of the screen and controlled by a first timing controller 111 (or denoted by TCON1). A second active area RU is disposed in an upper right half portion of the screen and controlled by a second timing controller 112 (or denoted by TCON2). A third active area LD is disposed in a lower left half portion of the screen and controlled by a third timing controller 113 (or denoted by TCON3). A fourth active area RD is disposed in a lower right half portion of the screen and controlled by a fourth timing controller 114 (or denoted by TCON4).

The data driver 12 includes source driver ICs SIC and may be connected to the data lines 14 and the sensing lines 15. The gate driver 13 may be directly formed on a substrate of the display panel PNL. In FIG. 5, "GIP (gate-in panel)" denotes the gate driver 13 directly formed on the substrate of the display panel PNL.

In FIG. 5, "LRB" denotes a first boundary line between the left active areas LU and LD and the right active areas RU and RD, and "UDB" denotes a second boundary line between the upper active areas LU and RU and the lower active areas LD and RD. The boundary lines LRB and UDB do not indicate that the substrate of the display panel PNL is physically divided, but are boundary lines indicating that the substrate of the display panel PNL is controlled by the different timing controllers 111 to 114.

A chip on film (COF), on which the source driver ICs SIC are mounted, is connected between the display panel PNL and a source printed circuit board (PCB). Gate timing control signals for controlling the gate drivers GIP and a gate driving voltage are transmitted to the gate drivers GIP on the display panel PNL through the COF.

The timing controllers 111 to 114 may be mounted on a control board CPCB together with a bridge IC 200. In FIG. 6, "BRDG" denotes the bridge IC 200. The timing controllers 111 to 114 may be implemented as an application-specific integrated circuit (ASIC), and the bridge IC 200 may be implemented as a field programmable gate array (FPGA). However, embodiments are not limited thereto.

The bridge IC 200 receives a high-resolution input image from a main board of a host system 300 and distributes the input image to the timing controllers 111 to 114 respectively corresponding to the active areas LU, RU, LD, and RD. The bridge IC 200 may execute a predetermined image quality improvement algorithm on pixel data of the input image received from the host system 300 to modulate the pixel data and distribute the modulated pixel data to the timing controllers 111 to 114.

The main board of the host system 300 includes a user input device for receiving a user command, a communication module for communicating with a peripheral device, a communication module connected to a communication network such as Internet, a graphic processing module connected to an electroluminescent display, and the like. The main board is connected to a power supply that generates electric power. The power supply supplies electric power from a commercial AC power source or a battery to the main board and the display panel driving circuit. The host system 300 may be a system requiring a display device such as a television system and a computer system.

A level shifter, a power management integrated circuit (PMIC), etc. may be mounted on the control board CPCB. The PMIC receives a DC input voltage using a DC-DC converter and outputs various DC voltages, for example, the voltages Vpre, EVDD, EVSS, VGH, VGL, and a gamma reference voltage required to drive the display panel PNL.

The level shifter shifts a voltage level of the gate timing control signal received from the timing controllers 111 to 114 and converts the voltage level of the gate timing control signal into a voltage swinging between a gate high voltage VGH and a gate low voltage VGL. The scan pulse output from the gate driver GIP swings between the gate high voltage VGH and the gate low voltage VGL. The gate high voltage VGH is a gate-on voltage capable of turning on the switching TFT of the pixel circuit, and the gate low voltage VGL is a gate-off voltage capable of turning off the switching TFT of the pixel circuit.

Each of the timing controllers 111 to 114 transmits the pixel data of the input image received from the bridge IC 200 to the source driver IC SIC taken charge of by each timing controller. Further, the timing controllers 111 to 114 transmit control data, clocks, etc. together with the pixel data of the input image to the source driver ICs SIC.

Each of the timing controllers 111 to 114 extracts timing signals, such as a vertical sync signal, a horizontal sync signal, a main clock, and a data enable signal, from an input image signal received through the bridge IC 200. Each of the timing controllers 111 to 114 generates timing control signals for controlling operation timings of the source driver IC SIC and the gate driver GIP using the timing signals. Each of the timing controllers 111 to 114 multiplies an input frame frequency of the input image signal by N and can control the source driver IC SIC and the gate driver GIP based on the input frame frequency, where N is a positive integer equal to or greater than 2. The input frame frequency is 50 Hz in a phase alternate line (PAL) method and is 60 Hz in a national television standards committee (NTSC) method.

The control board CPCB may be connected to a source PCB SPCB through a flexible flat cable (FFC) and connected to the main board of the host system 300 through the FFC.

The gate lines 16 are disposed in the left and right active areas that are seamlessly adjacent to each other across the first boundary line LRB between the left active areas LU and LD and the right active areas RU and RD. As shown in FIG. 7, gate drivers GIP1 to GIP4 are connected to both sides of the gate lines 16. The scan pulses are simultaneously applied to both sides of one gate line through the gate drivers GIP1 to GIP4 connected to both ends of the gate lines 16.

As shown in FIG. 7, the data lines 14 are separated at the second boundary line UDB between the upper active areas LU and RU and the lower active areas LD and RD. This is to reduce RC delay of the signals applied through the lines by reducing a RC load of the lines through a reduction in lengths of the data lines 14 and lengths of the sensing lines 15. The data lines 14 and the sensing lines 15 disposed in the upper half portion of the screen of the display panel PNL are connected to source driver ICs SIC1 and SIC2 taking charge of the upper active areas LU and RU. The data lines 14 and the sensing lines 15 disposed in the lower half portion of the screen of the display panel PNL are connected to source driver ICs SIC3 and SIC4 taking charge of the lower active areas LD and RD.

The first timing controller 111 transmits pixel data of the first active area LU received from the bridge IC 200 to the source driver IC SIC1 of first driving circuits SIC1 and GIP1. As shown in FIG. 7, the first timing controller 111 controls operation timing of the first driving circuits SIC1 and GIP1 for driving the pixels of the first active area LU.

The second timing controller 112 transmits pixel data of the second active area RU received from the bridge IC 200 to the source driver IC SIC2 of second driving circuits SIC2 and GIP2. As shown in FIG. 7, the second timing controller 112 controls operation timing of the second driving circuits SIC2 and GIP2 for driving the pixels of the second active area RU.

The third timing controller 113 transmits pixel data of the third active area LD received from the bridge IC 200 to the source driver IC SIC3 of third driving circuits SIC3 and GIP3. As shown in FIG. 7, the third timing controller 113 controls operation timing of the third driving circuits SIC3 and GIP3 for driving the pixels of the third active area LD.

The fourth timing controller 114 transmits pixel data of the fourth active area RD received from the bridge IC 200 to the source driver IC SIC4 of fourth driving circuits SIC4 and GIP4. As shown in FIG. 7, the fourth timing controller 114 controls operation timing of the fourth driving circuits SIC4 and GIP4 for driving the pixels of the fourth active area RD.

Each of the timing controllers 111 to 114 may modulate the pixel data received from the bridge IC 200 using a compensation value obtained from a previously set algorithm and transmit the modulated pixel data to the source driver ICs SIC1 to SIC4. The timing controllers 111 to 114 may receive logo data block on boundary surfaces between the active areas LU, RU, LD and RD, data operation result, error data, etc. from the bridge IC 200 and execute the algorithm based on them.

Figure 8:
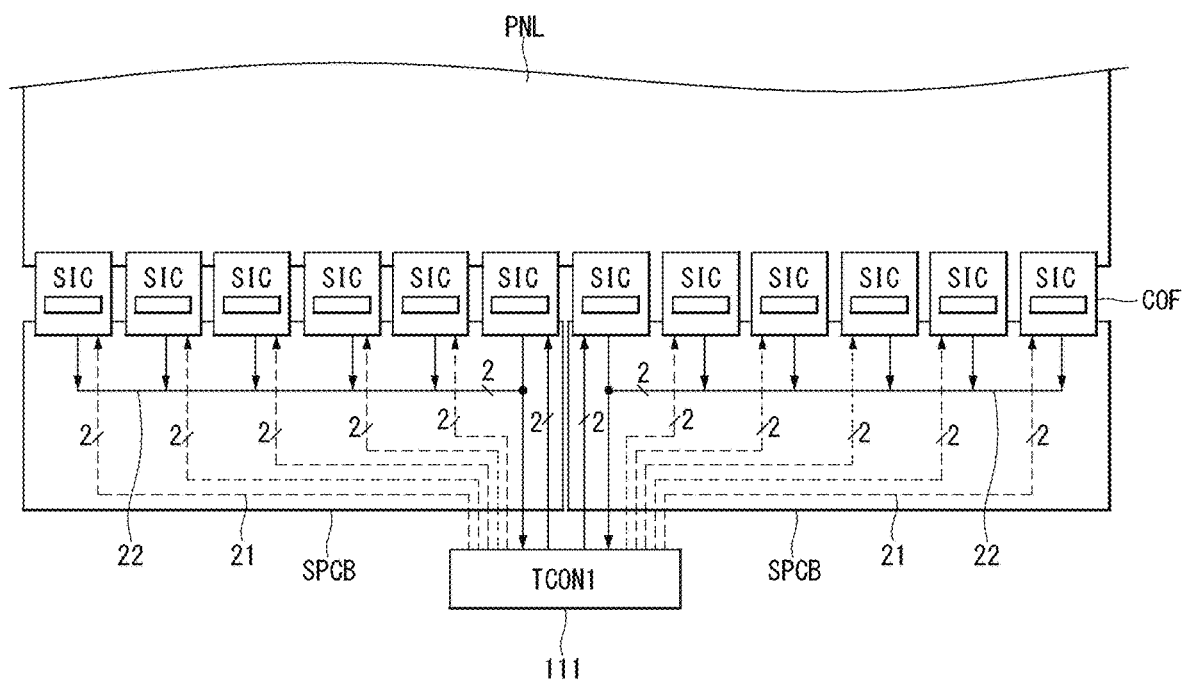
FIG. 8 illustrates in detail lines between a timing controller and source driver integrated circuits (ICs) according to an embodiment of the disclosure.

FIG. 8 illustrates in detail the connection of lines between the first timing controller 111 and the source driver ICs SIC. The second to fourth timing controllers 112 to 114 are connected to the source driver ICs through the same method as FIG. 8.

Referring to FIG. 8, each of source driver ICs SIC receives digital data of an input image from the first timing controller 111 through a first pair 21 of the data lines and transmits sensing data to the first timing controller 111 through a second pair 22 of the data lines. The sensing data transmitted to the first timing controller 111 includes driving characteristic sensing information of the pixels obtained through the sensing circuit.

Figure 9:
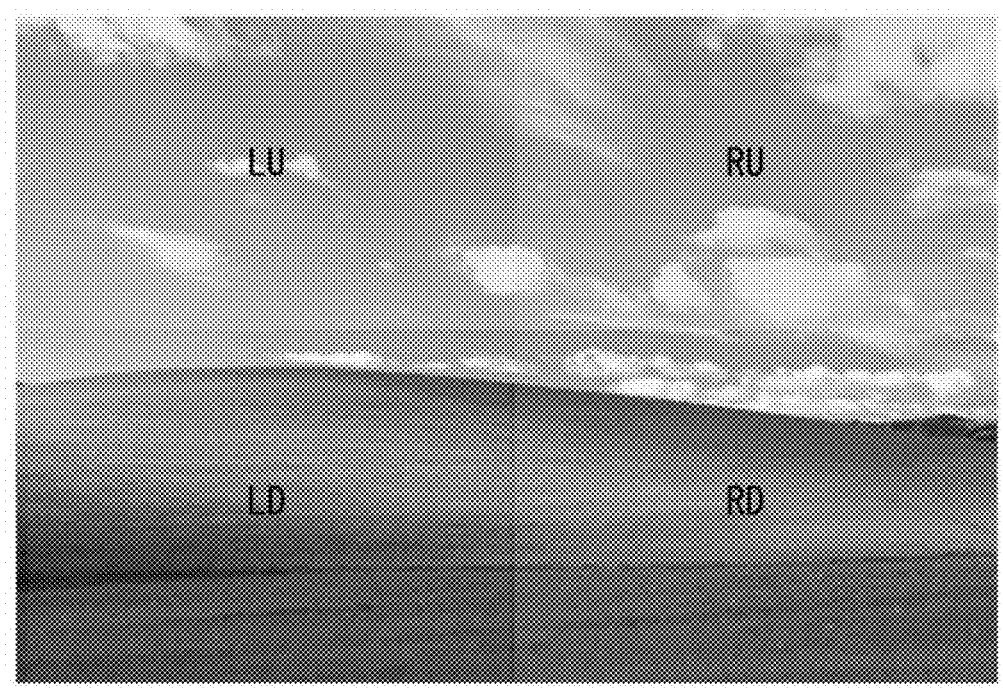
FIG. 9 illustrates an example where a luminance variation between active areas and a luminance variation at a boundary surface between the active areas are seen.

FIG. 9 illustrates an example where a luminance variation between the active areas LU, RU, LD and RD and a luminance variation at boundary surfaces between the active areas LU, RU, LD and RD are visible.

Referring to FIG. 9, various algorithms are executed on pixel data of an input image to improve image quality of an image displayed on the screen. Each of the timing controllers 111 to 114 includes a data operation unit that executes a previously set algorithm.

If a data operation result is not exchanged between the timing controllers 111 to 114, the data operation result is reflected only in the active areas LU, DU, LD and RD. Therefore, as shown in FIG. 9, there may be a luminance variation and a color difference between the active areas LU, RU, LD and RD and at boundary surfaces between the active areas LU, RU, LD and RD. For example, there may be a difference in grayscale-to-luminance characteristics between the active areas LU, RU, LD and RD. Hence, if the difference in grayscale-to-luminance characteristics between the active areas LU, RU, LD and RD is not compensated, a luminance difference between the active regions LU, RU, LD, and RD may be seen at the same gray level. Further, if an error between the active areas LU, RU, LD and RD is not diffused, the luminance variation may be seen at the boundary surfaces. The boundary surface indicates a pixel area having a predetermined size with respect to the boundary lines UDB and LRB.

In the embodiment of the disclosure, the bridge IC 200 executes an image quality improvement algorithm, in which integrated management of the entire screen is necessary to prevent the luminance variation shown in FIG. 9. In case of an algorithm in which a method of individually processing the error in the timing controllers 111 to 114 is more efficient, the algorithm is individually executed by the timing controllers 111 to 114. The embodiment of the disclosure can implement the screen of the high image quality, in which there is no luminance variation and color difference, at an 8K resolution screen using the four timing controllers 111 to 114 applied to an active area of 4K resolution through a pixel data distribution method of an input image using the bridge IC 200 and an algorithm distributed processing method.

The bridge IC 200 and the timing controllers 111 to 114 each include a data operation unit for processing various algorithms for improving the image quality, power consumption, the reliability, and the like.

Figure 10:
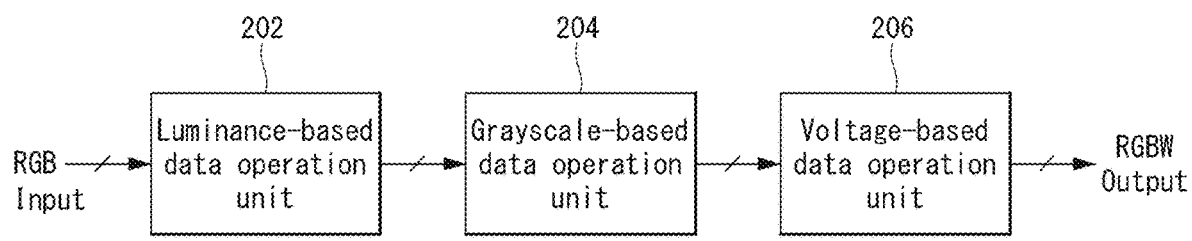
FIG. 10 illustrates a data operation unit according to an embodiment of the disclosure.

FIG. 10 illustrates an example of the data operation unit.

Referring to FIG. 10, the data operation unit includes a luminance-based data operation unit 202, a grayscale-based data operation unit 204, and a voltage-based data operation unit 206.

The luminance-based data operation unit 202 receives luminance area data receiving pixel data RGB of an input image. The luminance-based data operation unit 202 performs a de-gamma correction operation, that converts a gray level of the pixel data RGB into luminance data, on the pixel data RGB of the input image using a predetermined grayscale-to-luminance table. The luminance-based data operation unit 202 executes various predetermined luminance-based algorithms on the de-gamma corrected data. For example, the luminance-based data operation unit 202 executes a logo detection algorithm and detects the logo data from entire frame data of the input image. The luminance-based algorithm may include a pixel degradation prediction compensation algorithm. In the pixel degradation prediction compensation algorithm, the luminance-based data operation unit 202 predicts degradation of each pixel based on a predetermined degradation prediction model for each pixel and adds a compensation value to the relatively more degraded pixels, thereby forcibly increasing life span of the pixels. The luminance-based data operation unit 202 may execute an algorithm for converting RGB data into RGBW data.

The grayscale-based data operation unit 204 inversely converts luminance data into grayscale data, performs a gamma correction operation on the pixel data, and executes predetermined grayscale-based algorithms.

The voltage-based data operation unit 206 executes a voltage-based algorithm for operating the pixel data, in order to change voltages of the pixel data. Examples of the voltage-based algorithm include an external compensation algorithm. The external compensation algorithm compensates for driving characteristics of the pixel using a compensation value obtained based on a result of sensing the pixel and thus can improve the image quality and the life span of the pixel.

Each of the luminance-based data operation unit 202, the grayscale-based data operation unit 204, and the voltage-based data operation unit 206 may include an operation of an increase and a reduction in the number of bits of digital data. When the number of bits decreases, a quantization error is necessarily generated due to least significant bit (LSB). Each of the luminance-based data operation unit 202, the grayscale-based data operation unit 204, and the voltage-based data operation unit 206 may execute an error diffusion algorithm for distributing the quantization error to neighboring pixels to improve the image quality.

After the luminance-based data operation unit 202 performs the de-gamma correction operation and executes the algorithm for diffusing an error of the de-gamma corrected data, the timing controllers 111 to 114 may execute algorithms. However, when each of the timing controllers 111 to 114 independently execute the algorithms, the boundary surfaces may be seen between the divided active areas LU, RU, LD and RD, thereby causing the problem in the image quality and the operation. Considering this, the bridge IC 200 executes the luminance-based algorithm on frame data of the entire screen and then executes the error diffusion algorithm capable of solving the problem resulting from the luminance-based algorithm. Algorithms that do not generate waste of resources when being executed by the timing controllers 111 to 114 and are more efficient, may be executed by the timing controllers 111 to 114. A data operation result at the boundary surface and error data are transmitted to the bridge IC 200, and the timing controllers 111 to 114 exchange data at the boundary surface with each other.

Figure 11:
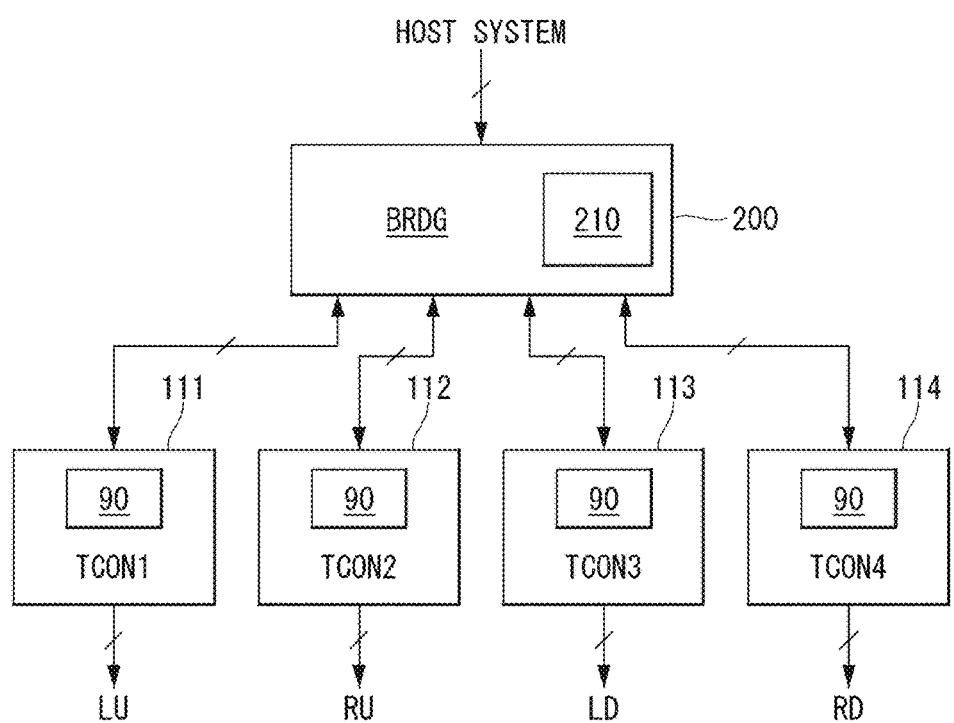
FIG. 11 illustrates a data operation unit of a bridge IC and data operation units of timing controllers according to an embodiment of the disclosure.

FIG. 11 illustrates examples of a data operation unit of the bridge IC 200 and data operation units of the timing controllers 111 to 114.

Referring to FIG. 11, the bridge IC 200 includes a first data operation unit 210. The first data operation unit 210 analyzes pixel data of an input image and performs an operation on the pixel data with respect to the active areas LU, RU, LD and RD of the entire screen. The pixel data of the input image output from the first data operation unit 210 is transmitted to the timing controllers 111 to 114 through low-voltage differential signaling (LVDS) interface.

The first data operation unit 210 of the bridge IC 200 executes the luminance-based algorithm.

The first data operation unit 210 executes a de-gamma correction algorithm on pixel data of the input image to be written to pixels at the boundary surfaces between the active areas. The de-gamma correction algorithm modulates pixel data received from the bridge IC 200 in a luminance area using a predetermined grayscale-to-luminance table and improves the image quality, the power consumption, and the reliability using various predetermined luminance-based algorithms. The first data operation unit 210 executes a first error diffusion algorithm. The first error diffusion algorithm distributes a quantization error (i.e., error data) generated by the de-gamma correction algorithm, to neighboring pixels.

The first data operation unit 210 may further execute one or more luminance-based algorithms among a logo detection algorithm, a peak luminance control (PLC) algorithm, a high dynamic range (HDR) algorithm, a peak luminance control algorithm at a still image, a maximum power consumption control algorithm, a power consumption improvement algorithm through a reduction in an outermost luminance of the screen, a screen transition detection algorithm, and a pixel degradation prediction compensation algorithm.

The logo detection algorithm executed by the bridge IC 200 detects logo data including still text, still image, etc. from the entire screen. The logo detection algorithm analyzes change in pixel data in units of block of a predetermined size and determines whether logo data is present or absent in the block based on the change in the pixel data in the block.

Each of the timing controllers 111 to 114 may detect the logo only from the active area taken charge of by each timing controller. Therefore, when each of the timing controllers 111 to 114 executes the logo detection algorithm, the timing controllers 111 to 114 may not detect logo data existing at the boundary surfaces between the active areas LU, RU, LD and RD. More specifically, when a pixel area existing at the boundary surface is smaller than the size of the block, logo data of the pixel area is not recognized by the timing controllers 111 to 114 because the logo data is detected on a per block basis as described above. Thus, a method of detecting logo data performed by the bridge IC 200 can prevent the detection omission of the logo data. A method of detecting logo data from the entire screen in the bridge IC 200 is more efficient than a method of collecting logo data detection results obtained from the timing controllers 111 to 114 and detecting again the logo data at the boundary surfaces.

In order to prevent the luminance variation at the boundary surfaces, the bridge IC 200 transmits the data operation result or the compensation value at the boundary surfaces between the active areas LU, RU, LD and RD to the timing controllers 111 to 114. Further, the bridge IC 200 transmits the data operation result of the algorithm executed by each of the timing controllers 111 to 114 to another timing controller.

The bridge IC 200 diffuses error data of the boundary surface received from the timing controllers 111 to 114 to pixel data to be written to neighboring pixels existing on the boundary surface and transmits the error data to the timing controllers 111 to 114. The bridge IC 200 distributes the error data of the boundary surface to the neighboring pixels and transmits the error data to the timing controllers 111 to 114, thereby preventing the luminance variation at the boundary surface and increasing the image quality of the boundary surface. The timing controllers 111 to 114 and the bridge IC 200 each include a data operation unit for executing the error diffusion algorithm.

The timing controllers 111 to 114 each include a second data operation unit 90. The second data operation unit 90 may execute a luminance-based algorithm, a grayscale-based algorithm, and a voltage-based algorithm. For example, the second data operation unit 90 executes a de-gamma correction algorithm, that converts a gray level of pixel data of an input image in each active area into luminance data using a grayscale-to-luminance table. The second data operation unit 90 may execute one or more of a camera compensation algorithm, an external compensation algorithm, and a pixel degradation prediction compensation algorithm. However, embodiments are not limited thereto and may execute various algorithms. Each data operation unit 90 and 210 may include the configuration of the data operation unit of FIG. 10.

The camera compensation algorithm modulates gray levels of pixel data using a lookup table which sets compensation values obtained based on a result of analyzing an image of the screen captured by a camera before shipping the product, thereby achieving the uniform luminance by removing stains on the screen. The compensation values are values obtained for compensating for the luminance variation, the stains, etc. of each pixel by analyzing the image of the screen captured by the camera. The compensation values are set in the lookup table and loaded to memories of the timing controllers 111 to 114 when electric power is supplied to the display panel driving circuit.

The external compensation algorithm senses in real time the driving characteristics of the pixel based on sensing data obtained from the pixel through the sensing circuit and reflects a compensation value selected based on the sensing result in the pixel data, thereby compensating for the driving characteristics of the pixel. Error data generated in the external compensation algorithm is distributed to neighboring pixels by the timing controllers 111 to 114 and the bridge IC 200.

The pixel degradation prediction compensation algorithm accumulates pixel data for each pixel, stores a driving history for each pixel, and predicts a luminance degradation of each pixel using a predetermined degradation prediction model and the driving history for each pixel. The pixel degradation prediction compensation algorithm reflects gains, that are previously set in order to compensate for the luminance degradation, in the pixel data so that pixels having different degradation levels can emit light with the same luminance at the same gray level, thereby increasing lifetime of the degraded pixel.

The second data operation unit 90 executes a second error diffusion algorithm for distributing an error generated in a data operation process to neighboring pixels. The number of bits of the pixel data may decrease in the data operation process executed by the second data operation unit 90 of each of the timing controllers 111 to 114. The second error diffusion algorithm distributes error data generated in the algorithm executed by the second data operation unit 90 to neighboring pixels.

The data operation process may require neighboring pixel data or a data operation result of the pixel data. If the timing controllers 111 to 114 do not share the data operation result with each other at the boundary surface, the data operation result of the algorithm may be inaccurate, resulting in the luminance variation at the boundary surface.

Figure 12:
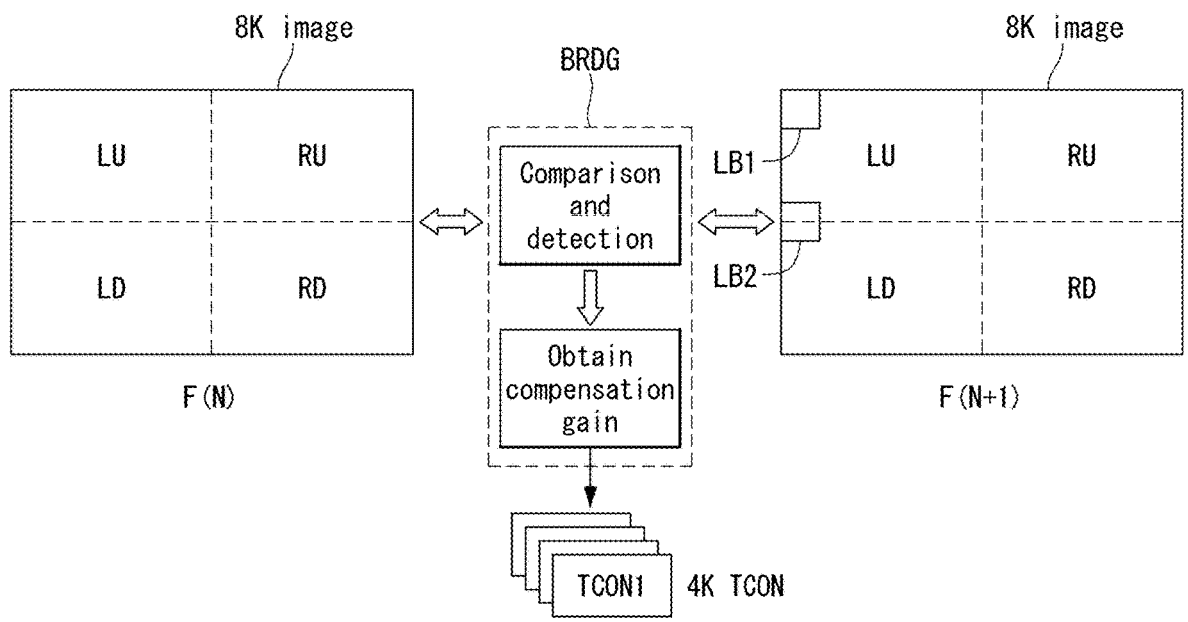
FIG. 12 illustrates a logo detection method according to an embodiment of the disclosure.

FIG. 12 illustrates a logo detection method according to an embodiment of the disclosure.

Referring to FIG. 12, the bridge IC 200 stores input image frame data of 8K resolution in a frame memory. A data processing capacity of the bridge IC 200 is larger than a data processing capacity of each of the timing controllers 111 to 114.

The bridge IC 200 compares pixel data between Nth frame data F(N) and (N+1)th frame data F(N+1) of an input image of 8K resolution in units of block of a predetermined size and detects logo data LB1 and LB2 not moving. The logo data LB2 is logo data existing at the boundary surface.

The bridge IC 200 transmits a logo data compensation gain to the timing controllers 111 to 114. The timing controllers 111 to 114 multiply or add the gain received from the bridge IC 200 by or to the logo data and reduce the degradation of the pixels to which the logo data is written.

The timing controllers 111 to 114 each receive data of the active area corresponding to ¼ of the screen. Because of this, the timing controllers 111 to 114 cannot detect the logo from the entire screen and cannot detect the logo existing on the boundary surfaces. Each of the timing controllers 111 to 114 may serve as a timing controller having a data processing capacity capable of processing an input image of 4K resolution.

Figure 13:
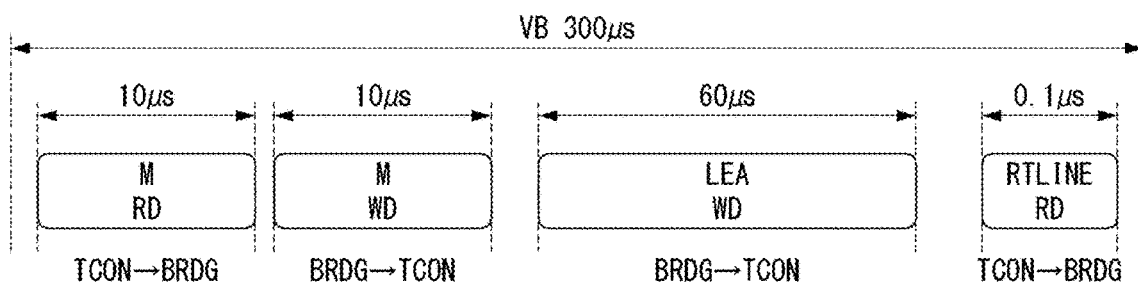
FIG. 13 illustrates data communication between a bridge IC and timing controllers in a vertical blanking interval according to an embodiment of the disclosure.

FIG. 13 illustrates data communication between the bridge IC 200 and the timing controllers 111 to 114 in a vertical blanking interval VB.

Referring to FIG. 13, the bridge IC 200 and the timing controllers 111 to 114 exchange data during a vertical blanking interval VB, in which no image data is input, in each frame period.

The bridge IC 200 reads data from the timing controllers 111 to 114 for 10 μs of an M RD portion of the vertical blanking interval VB. During the M RD portion, the timing controllers 111 to 114 transmit an identification code, a data operation result, temperature information, driving history information of each pixel, etc. to the bridge IC 200. The data operation result transmitted from the timing controllers 111 to 114 to the bridge IC 200 may include an average picture level (APL), high dynamic range (HDR) information for pixel data at the boundary surface, and the like. The more data operation results of the boundary surfaces from the timing controllers 111 to 114 may be transmitted to the bridge IC 200 in accordance with the algorithms executed by the timing controllers 111 to 114.

The bridge IC 200 transmits the data operation results of the boundary surface received from the timing controllers 111 to 114 to the timing controllers 111 to 114. The bridge IC 200 averages the temperature information received from the timing controllers 111 to 114 to calculate a temperature of the entire screen and averages the APL received from the timing controllers 111 to 114 to calculate an APL of the entire screen, thereby using them in the operation of pixel data of an input image. Further, the bridge IC 200 exchanges the HDR information of the boundary surface with the timing controllers 111 to 114.

The bridge IC 200 generates a PLC gain, an HDR boundary surface operation result, an integrated temperature (or average temperature) of the entire screen, integrated driving history information, etc. based on the information received from the timing controllers 111 to 114. The bridge IC 200 transmits them to the timing controllers 111 to 114 for 10 μs of an M WD portion of the vertical blanking interval VB.

The bridge IC 200 transmits the logo detection result to the timing controllers 111 to 114 during an LEA WD portion of the vertical blanking interval VB. Then, the timing controllers 111 to 114 transmit a real-time sensing result of the driving characteristics of the pixel received through the sensing circuit to the bridge IC 200 during an RTLINE RD portion of the vertical blanking interval VB.

Figure 14A:
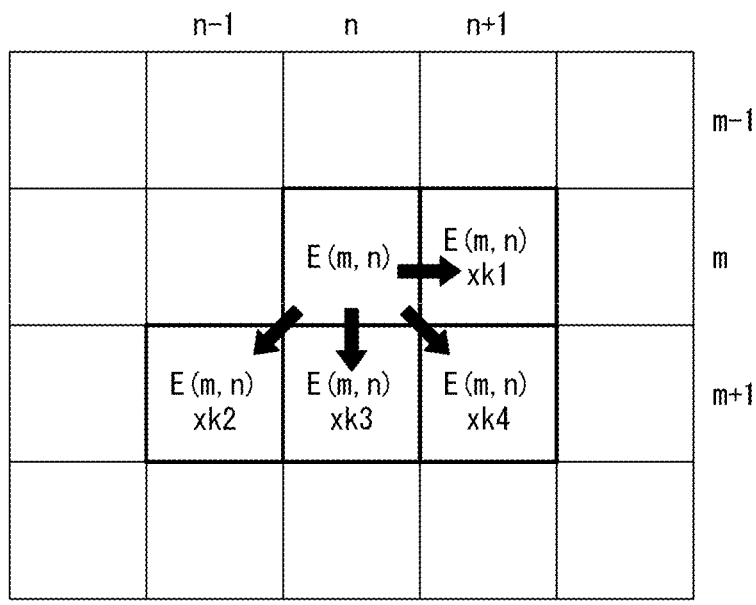
FIGS. 14A and 14B illustrate an example of an error diffusion method according to an embodiment of the disclosure.
Figure 14B:
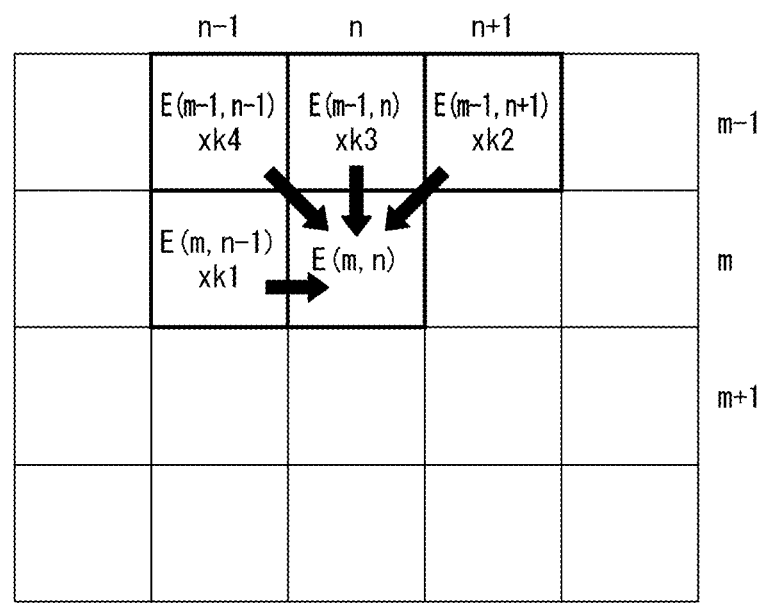

FIGS. 14A and 14B illustrate an example of an error diffusion method.

When the number of bits of pixel data increases in the data operation process and the data operation result is transferred to the source driver IC SIC, the number of bits may decrease. In this instance, an error of the pixel data may be generated. When an error value of a pixel P(m, n) positioned at an intersection of an mth row and an nth column is error data E(m, n), previously set coefficients k1 to k4 are multiplied by the error data E(m, n). Then, the operation results are added to pixel data to be written to neighboring pixels P(m, n+1), P(m+1, n−1), P(m+1, n), and P(m+1, n+1) using a method shown in FIG. 14A. Namely, E(m, n)*k1 is added to pixel data of the pixel P(m, n+1); E(m, n)*k2 is added to pixel data of the pixel P(m+1, n−1); E(m, n)*k3 is added to pixel data of the pixel P(m+1, n); and E(m, n)*k4 is added to pixel data of the pixel P(m+1, n+1). The error diffusion coefficients k1, k2, k3 and k4 may be set so that a sum of the error diffusion coefficients k1, k2, k3 and k4 satisfy 1. For example, k1 may be 7/16, k2 may be 1/16, k3 may be 5/16, and k4 may be 3/16. However, embodiments are not limited thereto.

As shown in FIG. 14B, error data E(m−1, n−1)*k4, E(m−1, n)*k3, E(m−1, n+1)*k2, and E(m, n−1)*k1) of neighboring pixels P(m−1, n−1), P(m−1, n), P(m−1, n+1), P(m, n−1) are added to the pixel P(m, n).

Figure 15:
FIG. 15 illustrates an error diffusion effect through a difference in image quality between when error data of a boundary surface is diffused and when it is not diffused.
Figure 15:

FIG. 15 illustrates an error diffusion effect through a difference in image quality between when error data of a boundary surface is diffused and when it is not diffused. In FIG. 15, (A) shows an original image; (B) shows an example where error data is uniformly diffused to the entire screen; and (C) shows an example where error data of a boundary surface is not diffused. As can be seen from FIG. 15, if error data at the boundary surfaces between the active areas LU, RU, LD, and RD is not diffused, a luminance difference can be seen at the boundary surfaces between the active areas LU, RU, LD, and RD.

Figure 16:
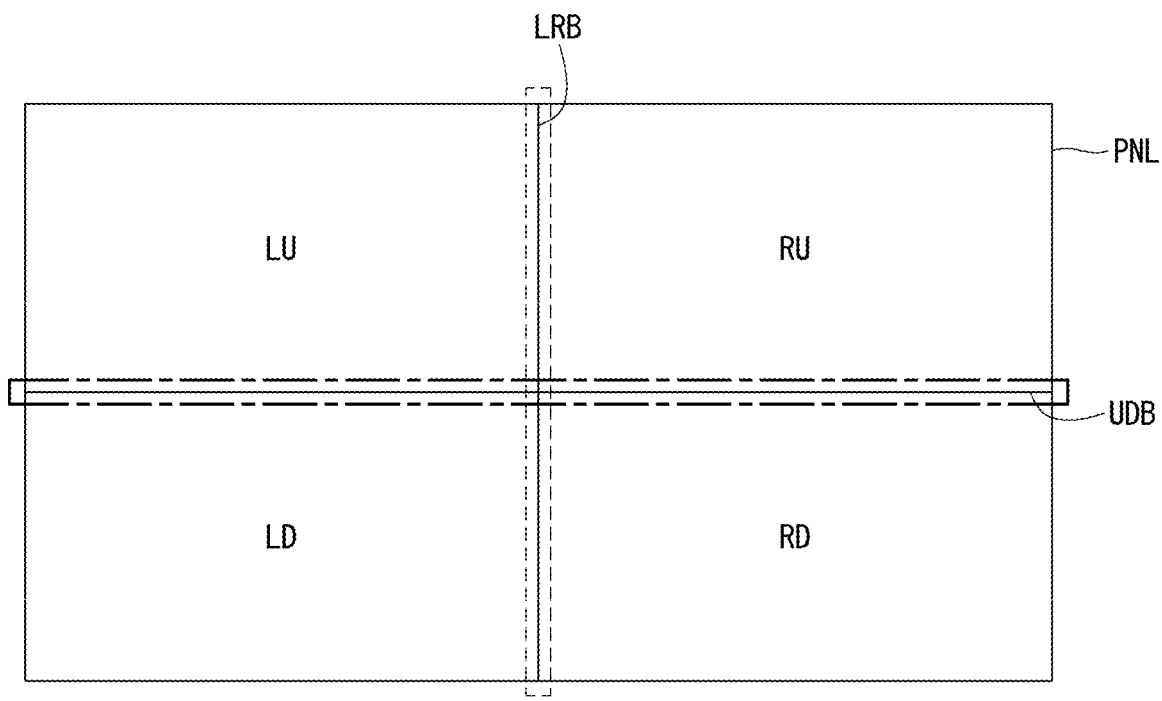
FIG. 16 illustrates an error diffusion method at a boundary surface according to an embodiment of the disclosure.

FIG. 16 illustrates an error diffusion method at a boundary surface.

Referring to FIG. 16, error data is distributed to pixels disposed at a first boundary surface (i.e., left-right boundary surface) between the left active areas LU and LD and the right active areas RU and RD divided along the first boundary line LRB. Pixel data is simultaneously written to the pixels disposed on the same line at the first boundary surface. Thus, the diffusion of the error data to the left and right pixels at the first boundary surface is performed in real time with little delay.

It is checked that error data is present between pixels disposed at a second boundary surface (i.e., upper-lower boundary surface) between the upper active areas LU and RU and the lower active areas LD and RD divided along the second boundary line UDB. There is a time interval of one frame period in data addressing time between two lines of the second boundary surface. The data addressing time is time at which pixel data is written to the pixels. For example, the first driving circuits SIC1 and GIP1 write upper half data of an Nth frame to the pixels of the first active area LU while sequentially scanning the first line at the uppermost side to the last line at the lowermost side of the first active area LU under the control of the first timing controller 111. And at the same time this, the third driving circuits SIC3 and GIP3 write the upper half data of the Nth frame to the pixels of the third active area LD while sequentially scanning the first line at the uppermost side to the last line at the lowermost side of the third active area LD under the control of the third timing controller 113. Thus, error data generated in the last line of the first active area LU is delayed by one frame period and is reflected in the first line of the third active area LD in a next frame period F(N+1).

The error diffusion at the boundary surface is performed by the bridge IC 200. The bridge IC 200 distributes error data of the boundary surface to neighboring pixels and transmits the error data to the timing controllers 111 to 114. The bridge IC 200 multiplies error data generated from an operation process of pixel data of the pixels belonging to the left active areas LU and LD on the first boundary surface by a predetermined coefficient and adds a multiplication result to pixel data of the pixels belonging to the right active areas RU and RD on the first boundary surface in one horizontal period 1H, thereby diffusing error data of the first boundary surface to the left and right active areas on the first boundary surface. The bridge IC 200 multiplies error data generated from an operation process of pixel data of the pixels belonging to the right active areas RU and RD on the first boundary surface by a predetermined coefficient and adds a multiplication result to pixel data of the pixels belonging to the left active areas LU and LD on the first boundary surface in a period that is equal to or longer than one horizontal period 1H and is shorter than two horizontal periods 2H, thereby diffusing error data of the first boundary surface to the left and right active areas on the first boundary surface. The bridge IC 200 multiplies error data of the upper active areas LU and RU on the second boundary surface by a predetermined coefficient, delays a multiplication result by one frame period, and adds the multiplication result to pixel data of the pixels belonging to the lower active areas LD and RD on the second boundary surface in a next frame period, thereby diffusing error data of the second boundary surface to the upper and lower active areas on the second boundary surface.

Figure 17:
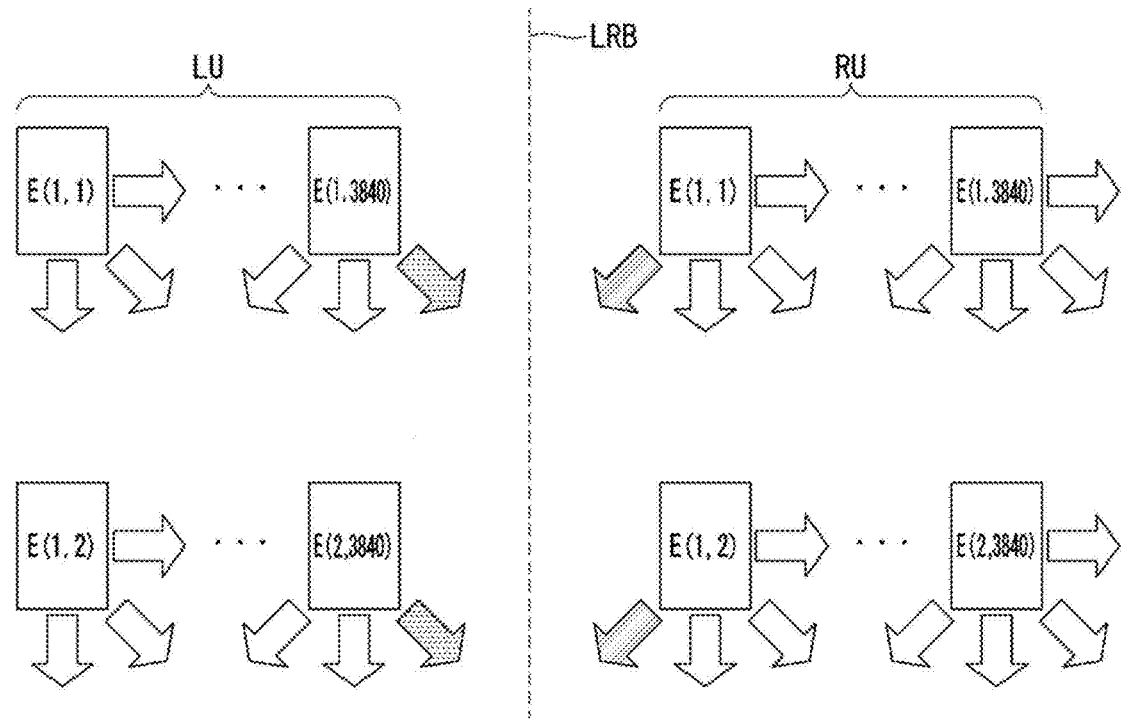
FIG. 17 illustrates a diffusion of error data at a boundary surface between left active areas and right active areas according to an embodiment of the disclosure.
Figure 18:
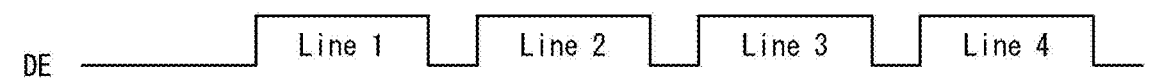
FIG. 18 is a waveform diagram illustrating a diffusion of error data between neighboring lines at a boundary surface in a data transmission sequence according to an embodiment of the disclosure.
Figure 18:
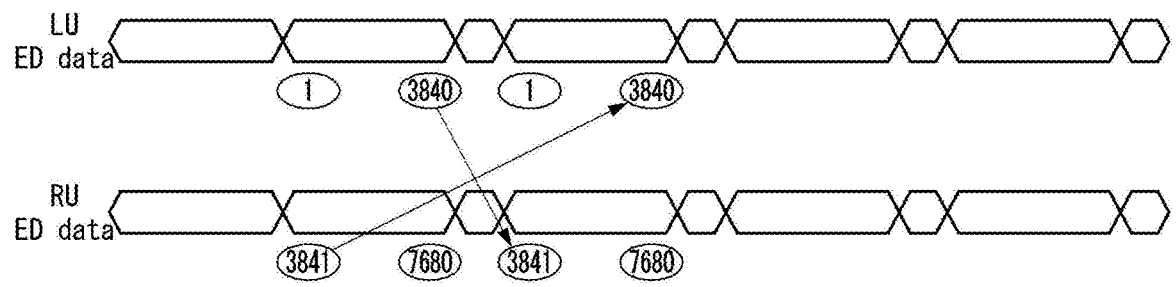

FIG. 17 illustrates a diffusion of error data at the boundary surface between the left active areas LU and LD and the right active areas RU and RD. FIG. 18 illustrates a diffusion of error data between neighboring lines at the boundary surface in a data transmission sequence. In FIG. 18, "DE" denotes a data enable signal synchronized with data of one line. One cycle of the data enable signal DE equals one horizontal period 1H.

Referring to FIGS. 17 and 18, error data of the pixels at the boundary surface between the left active areas LU and LD and the right active areas RU and RD is reflected in real time with little delay. Error data E(1, 3840) of a 3840th pixel disposed at a right end of the first active area LU on a first line Line1 is diffused to neighboring pixels of the 3840$^{th}$ pixel. A portion of the error data E(1, 3840) is reflected in pixel data of a 3841$^{th}$ pixel on a second line Line2 (i.e., a first pixel on the second line Line2 in the second active area RU). Error data of the left active area has to be reflected in pixel data of the right active area in one horizontal period, in order to perform the operation between error data of the left active area and the pixel data of the pixel of the right active area at the boundary surface between the left active areas LU and LD and the right active areas RU and RD. Thus, in this instance, as shown in FIG. 18, the transmission request time of the error data is equal to or longer than one horizontal period 1H and is shorter than two horizontal periods 2H.

Error data E(1, 1) of a 3841$^{th}$ pixel disposed at a left end of the second active area RU on the first line Line1 is diffused to neighboring pixels of the 3841th pixel. A portion of the error data E(1, 1) is reflected in a first pixel on the second line Line2 (i.e., the 3840th pixel disposed at a right end of the second line Line2 in the first active area LU). Error data of the right active area has to be reflected in pixel data of the left active area in two horizontal periods, in order to perform the operation between error data of the right active area and the pixel data of the pixel of the left active area at the boundary surface between the left active areas LU and LD and the right active areas RU and RD. Thus, in this instance, as shown in FIG. 18, the transmission request time of the error data is equal to or longer than one horizontal period 1H and is shorter than two horizontal periods 2H.

Figure 19:
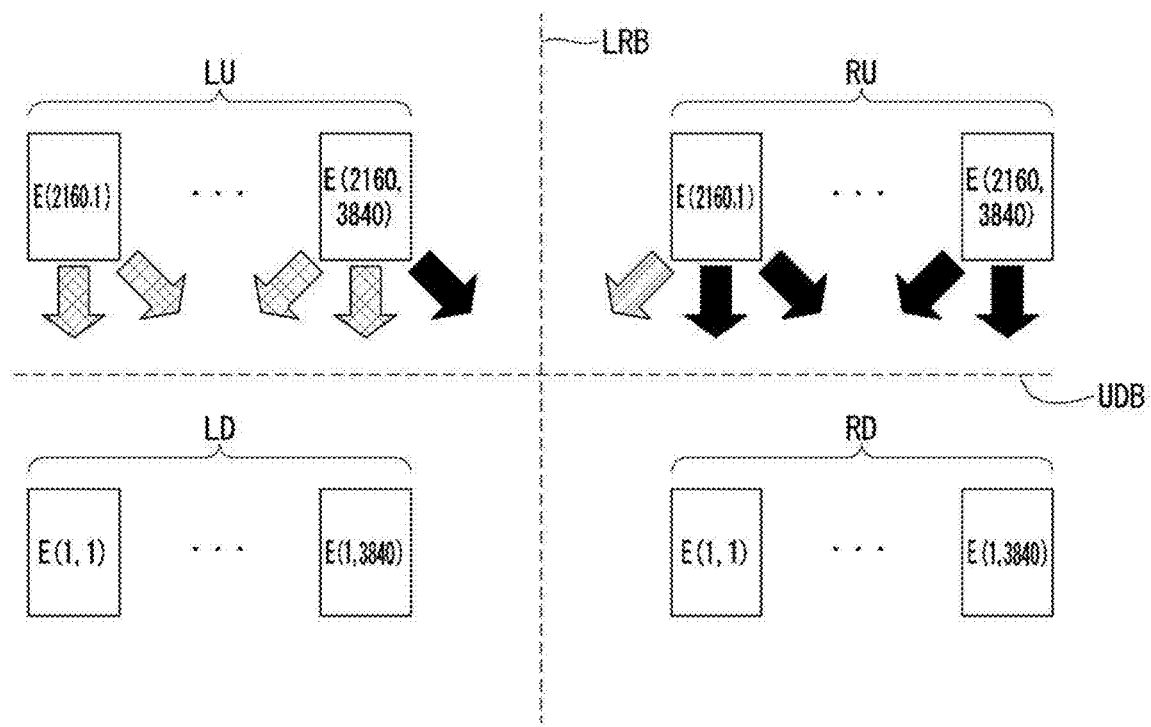
FIG. 19 illustrates a diffusion of error data at a boundary surface between upper active areas and lower active areas according to an embodiment of the disclosure.

FIG. 19 illustrates a diffusion of error data at the boundary surface between the upper active areas LU and RU and the lower active areas LD and RD.

Referring to FIG. 19, one frame period is delayed by a frame memory of the bridge IC 200 until error data of the pixels at the boundary surface between the upper active areas LU and RU and the lower active areas LD and RD is reflected in pixel data of a next line.

Error data E(2160, 1), . . . , E(2160, 3840) of a 2160th line disposed at lowermost sides of the upper active areas LU and RU pixels is reflected in pixels on a next line 2161th line (i.e., pixels on a first line disposed at uppermost sides of the lower active areas LD and RD) after one frame period.

Figure 20:
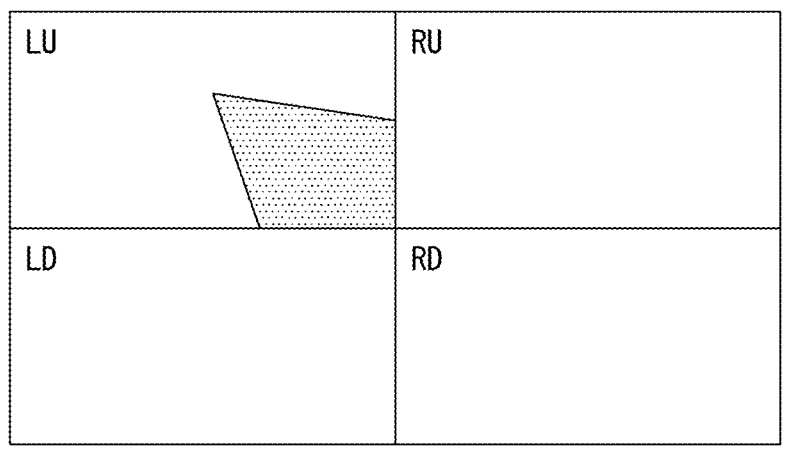
FIG. 20 illustrates a method of checking whether or not a diffusion of error data between active areas is performed according to an embodiment of the disclosure.
Figure 20:
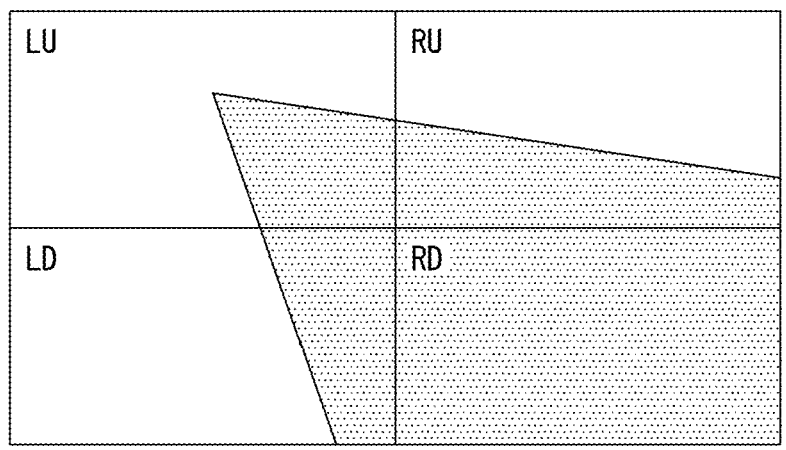

FIG. 20 illustrates a method of checking whether or not a diffusion of error data between active areas is performed. Because a quantization error is represented as 1-gray level, it is possible to check on the screen whether or not the error diffusion between the active areas is performed when an object (e.g., a mouse pointer in FIG. 20) is displayed on the screen by adjusting digital data or the data voltage so that 1-gray level is clearly seen. FIG. 20 is an example where a gray level of the pixels, to which error data is distributed, is changed from 127 to 128 due to the diffusion of error data generated by mouse pointer data.

The bridge IC 200 transmits error data of the boundary surface to the timing controllers 111 to 114 in each horizontal blanking interval HB. If the bridge IC 200 transmits data through V-by-one interface, the bridge IC 20 may code the error data in control bits defined in V-by-one protocol and transmit the error data to the timing controllers 111 to 1114 in each horizontal blanking interval HB.

The vertical blanking interval VB and the horizontal blanking interval HB are described with reference to FIG. 21 which illustrates display timing of Video Electronics Standards Association (VESA) standard.

Figure 21:
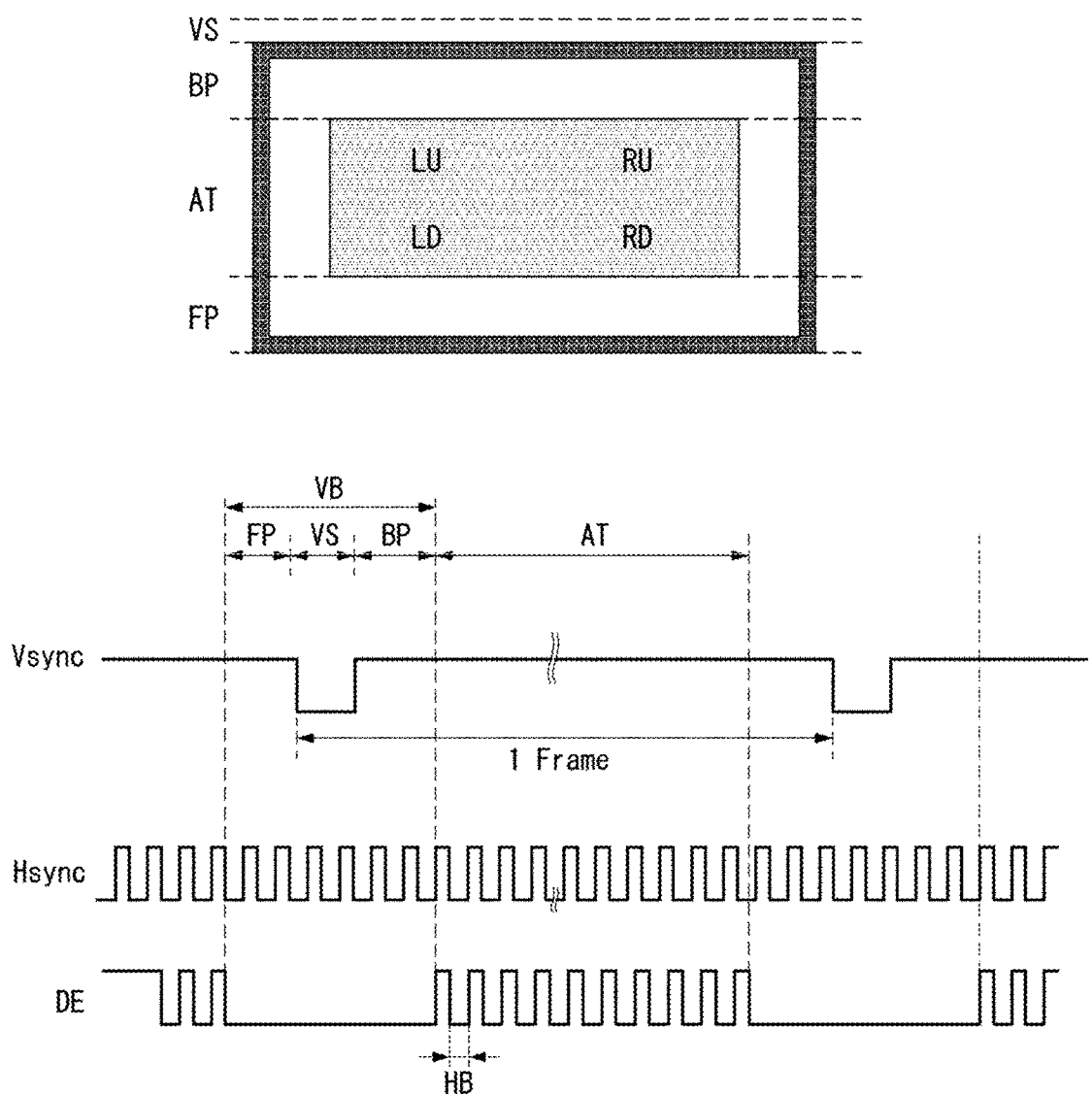
FIG. 21 illustrates a vertical blanking interval and a horizontal blanking interval according to an embodiment of the disclosure.

Referring to FIG. 21, the vertical sync signal Vsync defines one frame period. The horizontal sync signal Hsync defines one horizontal period. The data enable signal DE is synchronized with data of one line and defines an effective data interval. A cycle of one pulse of the data enable signal DE is one horizontal period. One horizontal period is a data addressing time required to write data to the pixels disposed on one line of the display panel PNL.

The data enable signal DE and pixel data of an input image are input during an active period AT which is an image display period, and are not input during the vertical blanking interval VB. One frame period is a time required to write data of one frame to pixels of the entire screen. One frame period is a sum of one active period AT and one vertical blanking interval VB. The horizontal blanking interval HB is a period in which there is no data in one horizontal period.

The vertical blanking interval VB includes a vertical sync time VS, a vertical front porch FP, and a vertical back porch BP.

The embodiments of the disclosure are not limited to an example where four timing controllers are connected to one bridge. For example, the embodiments of the disclosure may be applied to an example where the screen of the display panel is divided into two active areas that are respectively controlled by two timing controllers.

As described above, the embodiments of the disclosure connect two or more timing controllers, that each have a small capacity and dividedly control pixels of the active areas, to one bridge circuit, detect logo data from the entire screen using the bridge circuit, and transmit the logo data to the timing controllers, thereby compensating for pixel data without omitting the logo detection at the boundary surface between the active areas. Hence, the embodiments of the disclosure can achieve uniform image quality throughout the entire screen.

The embodiments of the disclosure perform the diffusion of error data between the active areas at the boundary surface between the active areas using the bridge circuit, thereby achieving the high image quality throughout the entire screen without the luminance variation and the color variation between the active areas and without the luminance variation and the color variation between the active areas and the boundary surfaces.

The embodiments of the disclosure integrally manage data of the independent algorithms between the dividedly driven active areas using the bridge circuit and integrally process the integrated luminance, the local luminance, the current limit calculation, etc. in the entire screen, thereby preventing the non-uniform image quality throughout the entire screen and improving the operation stability.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display comprising:
    first and second active areas divided from a screen on which pixels are disposed in a matrix;
    a first driving circuit configured to write pixel data to pixels of the first active area;
    a first timing controller configured to transmit the pixel data of the first active area to be displayed on the first active area to the first driving circuit, and control the first driving circuit;
    a second driving circuit configured to write pixel data to pixels of the second active area;
    a second timing controller configured to transmit the pixel data of the second active area to be displayed on the second active area to the second driving circuit, and control the second driving circuit;
    a bridge circuit configured to:
        distribute an input image to the first and second timing controllers,
        detect a logo data block from the input image for a logo that is displayed across a boundary surface between the first active area and the second active area,
        generate a logo data compensation value based on the detected logo data block, and
        transmit the logo data block to the first and second timing controllers and transmit the logo data compensation value to at least one of the first and second timing controllers; and
    a sensing circuit configured to sense driving characteristics of the pixels of the first active area and the pixels of the second active area,
    wherein each of the first and second timing controllers obtains a compensation value based on a sensing result received through the sensing circuit, reflects the compensation value in the pixel data through a data operation, and distributes error data generated in a data operation process to neighboring pixels, and
    wherein each of the first and second timing controllers transmits error data, that is generated in an operation process of pixel data to be written to pixels existing at a boundary surface between the first and second active areas, to the bridge circuit.

2. The electroluminescent display of claim 1, wherein each of the first and second timing controllers modulates pixel data received from the bridge circuit using a predetermined grayscale-to-luminance table and distributes error data generated in a process of modulating the pixel data to neighboring pixels, and
    wherein each of the first and second timing controllers transmits error data, that is generated in an operation process of pixel data to be written to pixels existing at a boundary surface between the first and second active areas, to the bridge circuit.

3. The electroluminescent display of claim 2, wherein the bridge circuit diffuses the error data received from the first and second timing controllers to pixel data to be written to the neighboring pixels, and transmits the error data to the first and second timing controllers.

4. The electroluminescent display of claim 1, wherein the bridge circuit diffuses error data received from the first and second timing controllers to pixel data to be written to the neighboring pixels, and transmits the error data to the first and second timing controllers.

5. An electroluminescent display comprising:
    a first active area disposed in an upper left portion of a screen on which pixels are disposed in a matrix;
    a second active area disposed in an upper right portion of the screen;
    a third active area disposed in a lower left portion of the screen;
    a fourth active area disposed in a lower right portion of the screen;
    a first driving circuit configured to write pixel data to pixels of the first active area;
    a first timing controller configured to transmit the pixel data of the first active area to be displayed on the first active area to the first driving circuit and control the first driving circuit;
    a second driving circuit configured to write pixel data to pixels of the second active area;
    a second timing controller configured to transmit the pixel data of the second active area to be displayed on the second active area to the second driving circuit, and control the second driving circuit;
    a third driving circuit configured to write pixel data to pixels of the third active area;
    a third timing controller configured to transmit the pixel data of the third active area to be displayed on the third active area to the third driving circuit, and control the third driving circuit;
    a fourth driving circuit configured to write pixel data to pixels of the fourth active area;
    a fourth timing controller configured to transmit the pixel data of the fourth active area to be displayed on the fourth active area to the fourth driving circuit, and control the fourth driving circuit;
    a bridge circuit configured to:
        distribute an input image to the first to fourth timing controllers,
        detect a logo data block from the input image for a logo that is displayed across a boundary surface between at least two of the first to fourth active areas,
        generate a logo data compensation value based on the detected logo data block, and
        transmit the logo data block to the first to fourth timing controllers and transmit the logo data compensation value to at least one of the first to fourth timing controllers; and
    a sensing circuit configured to sense driving characteristics of the pixels of the first active area, the pixels of the second active area, the pixels of the third active area and the pixels of the fourth active area, wherein each of the first to fourth timing controllers obtains a compensation value based on a sensing result received through the sensing circuit, reflects the compensation value in the pixel data through a data operation, and distributes error data generated in a data operation process to neighboring pixels, and wherein each of the first to fourth timing controllers transmits error data, that is generated in an operation process of pixel data to be written to pixels existing at a boundary surface between the first to fourth active areas, to the bridge circuit.

6. The electroluminescent display of claim 5, wherein each of the first to fourth timing controllers modulates pixel data received from the bridge circuit using a predetermined grayscale-to-luminance table and distributes error data generated in a process of modulating the pixel data to neighboring pixels, and wherein each of the first to fourth timing controllers transmits error data, that is generated in an operation process of pixel data to be written to pixels existing at a boundary surface between the first to fourth active areas, to the bridge circuit.

7. The electroluminescent display of claim 6, wherein the bridge circuit diffuses the error data received from the first to fourth timing controllers to pixel data to be written to the neighboring pixels, and transmits the error data to the first to fourth timing controllers.

8. The electroluminescent display of claim 5, wherein the bridge circuit diffuses error data received from the first to fourth timing controllers to pixel data to be written to the neighboring pixels, and transmits compensation data to the first to fourth timing controllers based on the error data received from the first to fourth timing controllers.

9. The electroluminescent display of claim 5, wherein the bridge circuit distributes error data of pixel data to be written to pixels on a left-right boundary surface between a left active area including the first and third active areas and a right active area including the second and fourth active areas to neighboring pixels, and transmits the error data to the first to fourth timing controllers, and wherein the bridge circuit distributes error data of pixel data to be written to pixels on an upper-lower boundary surface between an upper active area including the first and second active areas and a lower active area including the third and fourth active areas to neighboring pixels.

10. The electroluminescent display of claim 9, wherein the bridge circuit multiplies error data of the left active area on the left-right boundary surface by a predetermined coefficient and adds a multiplication result to pixel data of the right active area on the left-right boundary surface within one horizontal period, and wherein the bridge circuit multiplies error data of the right active area on the left-right boundary surface by a predetermined coefficient and adds a multiplication result to pixel data of the left active area on the left-right boundary surface within a period that is equal to or longer than one horizontal period and is less than two horizontal periods.

11. The electroluminescent display of claim 10, wherein the bridge circuit multiplies error data of the upper active area on the upper-lower boundary surface by a predetermined coefficient, delays a multiplication result by one frame period, and adds the multiplication result to pixel data of the lower active area on the upper-lower boundary surface in a next frame period.

12. A driving device for an electroluminescent display, the driving device comprising:

a first timing controller configured to transmit pixel data of a first active area to be displayed on the first active area to a first driving circuit writing pixel data to pixels of the first active area, and control the first driving circuit;

a second timing controller configured to transmit pixel data of a second active area to be displayed on the second active area to a second driving circuit writing pixel data to pixels of the second active area, and control the second driving circuit;

a third timing controller configured to transmit pixel data of a third active area to be displayed on the third active area to a third driving circuit writing pixel data to pixels of the third active area, and control the third driving circuit;

a fourth timing controller configured to transmit pixel data of a fourth active area to be displayed on the fourth active area to a fourth driving circuit writing pixel data to pixels of the fourth active area, and control the fourth driving circuit;

a bridge circuit configured to:
distribute an input image to the first to fourth timing controllers,
detect a logo data block from the input image for a logo that is displayed across a boundary surface between at least two of the first to fourth active areas,
generate a logo data compensation value based on the detected logo data block, and
transmit the logo data block to the first to fourth timing controllers and transmit the logo data compensation value to at least one of the first to fourth timing controllers;

and a sensing circuit configured to sense driving characteristics of the pixels of the first active area, the pixels of the second active area, the pixels of the third active area and the pixels of the fourth active area, wherein each of the first to fourth timing controllers obtains a compensation value based on a sensing result received through the sensing circuit, reflects the compensation value in the pixel data through a data operation, and distributes error data generated in a data operation process to neighboring pixels, and wherein each of the first to fourth timing controllers transmits error data, that is generated in an operation process of pixel data to be written to pixels existing at a boundary surface between the first to fourth active areas, to the bridge circuit.

13. The driving device for the electroluminescent display of claim 12, wherein the bridge circuit diffuses the error data received from the first to fourth timing controllers to pixel data to be written to the neighboring pixels and transmits the error data to the first to fourth timing controllers.

* * * * *